(12) United States Patent
Woo et al.

(10) Patent No.: US 12,484,230 B2
(45) Date of Patent: Nov. 25, 2025

(54) THREE-DIMENSIONAL SEMICONDUCTOR DEVICE INCLUDING FERROELECTRIC TRANSISTOR

(71) Applicant: Samsung Electronics Co., Ltd., Suwon-si (KR)

(72) Inventors: Jongho Woo, Suwon-si (KR); Youngji Noh, Suwon-si (KR); Minjun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 407 days.

(21) Appl. No.: 18/301,597

(22) Filed: Apr. 17, 2023

(65) Prior Publication Data

US 2024/0032303 A1   Jan. 25, 2024

(30) Foreign Application Priority Data

Jul. 21, 2022   (KR) ........................ 10-2022-0090613

(51) Int. Cl.
*H10B 51/20* (2023.01)
*H10B 51/30* (2023.01)
*H10B 51/40* (2023.01)

(52) U.S. Cl.
CPC ............. *H10B 51/20* (2023.02); *H10B 51/30* (2023.02); *H10B 51/40* (2023.02)

(58) Field of Classification Search
CPC ........ H10B 51/20; H10B 51/30; H10B 51/40; H10B 51/10; H10B 51/50
See application file for complete search history.

(56) References Cited

U.S. PATENT DOCUMENTS

| | | | |
|---|---|---|---|
| 10,388,699 B2 | 8/2019 | Park et al. | |
| 2016/0118404 A1* | 4/2016 | Peng | H10D 30/701 257/295 |
| 2020/0075631 A1 | 3/2020 | Dong et al. | |
| 2021/0126013 A1 | 4/2021 | Lai et al. | |
| 2021/0375927 A1 | 12/2021 | Chia et al. | |
| 2021/0375932 A1 | 12/2021 | Wang et al. | |
| 2021/0375937 A1* | 12/2021 | Wu | H10D 64/693 |
| 2021/0407569 A1 | 12/2021 | Young et al. | |
| 2022/0005830 A1 | 1/2022 | Wu et al. | |
| 2022/0036931 A1 | 2/2022 | Lin et al. | |

* cited by examiner

*Primary Examiner* — Thanh Y. Tran
(74) *Attorney, Agent, or Firm* — Fish & Richardson P.C.

(57) ABSTRACT

A three-dimensional semiconductor device includes a plate common source line, first and second word lines spaced apart from each other to at least partially define a vertical space therebetween, a channel pattern in the vertical space, a ferroelectric layer including a first portion between the channel pattern and the first word line, a second portion between the channel pattern and the second word line, and a third portion contacting the plate common source line, a bit line in the vertical space to contact the channel pattern and having a first width in a first horizontal direction, and a source line spaced apart from the bit line in the vertical space to contact the channel pattern, having a second width greater than the first width in the first horizontal direction, and having a source line contact portion inside the plate common source line.

20 Claims, 39 Drawing Sheets

X1 – X1'

X1 – X1'

X1 - X1'

Y1 – Y1'

Y1 - Y1'

X1 – X1'

X1 – X1'

X1 – X1'

X1 – X1'

X1 - X1'

THREE-DIMENSIONAL SEMICONDUCTOR DEVICE INCLUDING FERROELECTRIC TRANSISTOR

CROSS-REFERENCE TO RELATED APPLICATION

This application is based on and claims priority under 35 U.S.C. § 119 to Korean Patent Application No. 10-2022-0090613, filed on Jul. 21, 2022, in the Korean Intellectual Property Office, the disclosure of which is incorporated by reference herein in its entirety.

BACKGROUND

The inventive concepts relate to semiconductor devices, and more particularly, to a three-dimensional semiconductor device including a ferroelectric transistor, and a method of fabricating the three-dimensional semiconductor device.

Due to the development of electronic technology, semiconductor devices have been rapidly down-scaled in recent years, and thus, three-dimensional semiconductor devices including three-dimensionally arranged memory cells have been proposed.

SUMMARY

Some example embodiments of the inventive concepts provide a three-dimensional semiconductor device having a structure, which has an advantage in causing a three-dimensional-structure cell array including a ferroelectric transistor to be fine-sized and highly integrated, and which enables the reliability and degree of integration of the three-dimensional semiconductor device set forth above to be improved even when the number of stacked cells overlapping each other in a vertical direction in the three-dimensional-structure cell array is increased.

According to some example embodiments of the inventive concepts, a three-dimensional semiconductor device may include a plate common source line, a first word line and a second word line, which are arranged over the plate common source line and are spaced apart from each other such that opposing side surfaces of the first word line and the second word line at least partially define a vertical space therebetween, a channel pattern extending lengthwise in a vertical direction in the vertical space, a ferroelectric layer, which includes a first portion of the ferroelectric layer, which is between the channel pattern and the first word line, a second portion of the ferroelectric layer, which is between the channel pattern and the second word line, and a third portion of the ferroelectric layer, which contacts the plate common source line, a bit line arranged in the vertical space to contact the channel pattern and having a first width in a first horizontal direction, and a source line, which is spaced apart from the bit line in the vertical space to contact the channel pattern and has a second width that is greater than the first width of the bit line in the first horizontal direction, the source line having a source line contact portion that extends to an inside of the plate common source line through the ferroelectric layer, wherein the first word line and the second word line are spaced apart from each other in a second horizontal direction that is perpendicular to the first horizontal direction, such that the opposing side surfaces of the first word line and the second word line at least partially define the vertical space therebetween in the second horizontal direction.

According to some example embodiments of the inventive concepts, a three-dimensional semiconductor device may include a plate common source line, a plurality of first word lines arranged over a first region of the plate common source line to overlap each other in a vertical direction and extending lengthwise in a first horizontal direction, a plurality of second word lines arranged over a second region of the plate common source line to overlap each other in the vertical direction and extending lengthwise in the first horizontal direction, the second region of the plate common source line being apart from the first region of the plate common source line in a second horizontal direction that is perpendicular to the first horizontal direction, an insulating block arranged between the plurality of first word lines and the plurality of second word lines to at least partially define a vertical space extending in the vertical direction, a channel pattern extending lengthwise in the vertical direction in the vertical space, a ferroelectric layer, which includes a first portion of the ferroelectric layer, which is between the channel pattern and the plurality of first word lines, a second portion of the ferroelectric layer, which is between the channel pattern and the plurality of second word lines, and a third portion of the ferroelectric layer, which contacts the plate common source line, a bit line arranged in the vertical space to contact the channel pattern and having a first width in the first horizontal direction, and a source line, which is spaced apart from the bit line in the vertical space to contact the channel pattern and has a second width that is greater than the first width of the bit line in the first horizontal direction, the source line having a source line contact portion that extends to an inside of the plate common source line through the ferroelectric layer.

According to some example embodiments of the inventive concepts, a three-dimensional semiconductor device may include a peripheral circuit structure, which includes a plurality of transistors and a plurality of wiring structures respectively connected to the plurality of transistors, a plate common source line covering the peripheral circuit structure, a plurality of word lines arranged parallel to each other in a first horizontal direction over the plate common source line and overlapping each other in a vertical direction, a plurality of insulating blocks arranged respectively on opposite sides of the plurality of word lines in a second horizontal direction, which is perpendicular to the first horizontal direction, and defining a plurality of vertical spaces that extend in the vertical direction on the opposite sides of the plurality of word lines, and a plurality of cell structures respectively arranged in separate, respective vertical spaces of the plurality of vertical spaces, wherein each of the plurality of cell structures includes a channel pattern having a cylindrical shape extending lengthwise in the vertical direction, a ferroelectric layer, which includes a first portion of the ferroelectric layer, which is between the channel pattern and the plurality of word lines and a second portion of the ferroelectric layer, which contacts the plate common source line, a bit line contacting the channel pattern and having a first width in the first horizontal direction, and a source line, which is spaced apart from the bit line to contact the channel pattern and has a second width that is greater than the first width of the bit line in the first horizontal direction, the source line having a source line contact portion that extends to an inside of the plate common source line through the ferroelectric layer.

BRIEF DESCRIPTION OF THE DRAWINGS

Example embodiments will be more clearly understood from the following detailed description taken in conjunction with the accompanying drawings in which:

FIG. 1A is a plan view illustrating a configuration of the three-dimensional semiconductor device at a first vertical level of FIGS. 1B and 1C, FIG. 1B is a cross-sectional view of the three-dimensional semiconductor device, taken along a line X1-X1' of FIG. 1A, FIG. 1C is a cross-sectional view of the three-dimensional semiconductor device, taken along a line Y1-Y1' of FIG. 1A, and FIG. 1D is a partially enlarged plan view of a region EX1 of FIG. 1A;

FIG. 2A is a plan view of a configuration of the three-dimensional semiconductor device at a first vertical level of FIG. 2B, and FIG. 2B is a cross-sectional view of FIG. 2A, taken along a line X1-X1' of FIG. 2A;

FIGS. 7A, 8A, 9A, 10A, 11A, 12A, 13A, and 14A are plan views illustrating the method of fabricating a three-dimensional semiconductor device according to the sequence of processes, respectively, FIGS. 7B, 8B, 9B, 10B, 11B, 12B, 13B, and 14B are cross-sectional views taken along a line X1-X1' of FIGS. 7A, 8A, 9A, 10A, 11A, 12A, 13A, and 14A, respectively, and FIGS. 7C, 8C, 9C, 10C, and 11C are cross-sectional views taken along a line Y1-Y1' of FIGS. 7A, 8A, 9A, 10A, and 11A, respectively;

FIGS. 15A and 16A are plan views illustrating the method of fabricating a three-dimensional semiconductor device according to the sequence of processes, respectively, and FIGS. 15B and 16B are cross-sectional views taken along a line X1-X1' of FIGS. 15A and 16A, respectively.

DETAILED DESCRIPTION

Figure 1A:
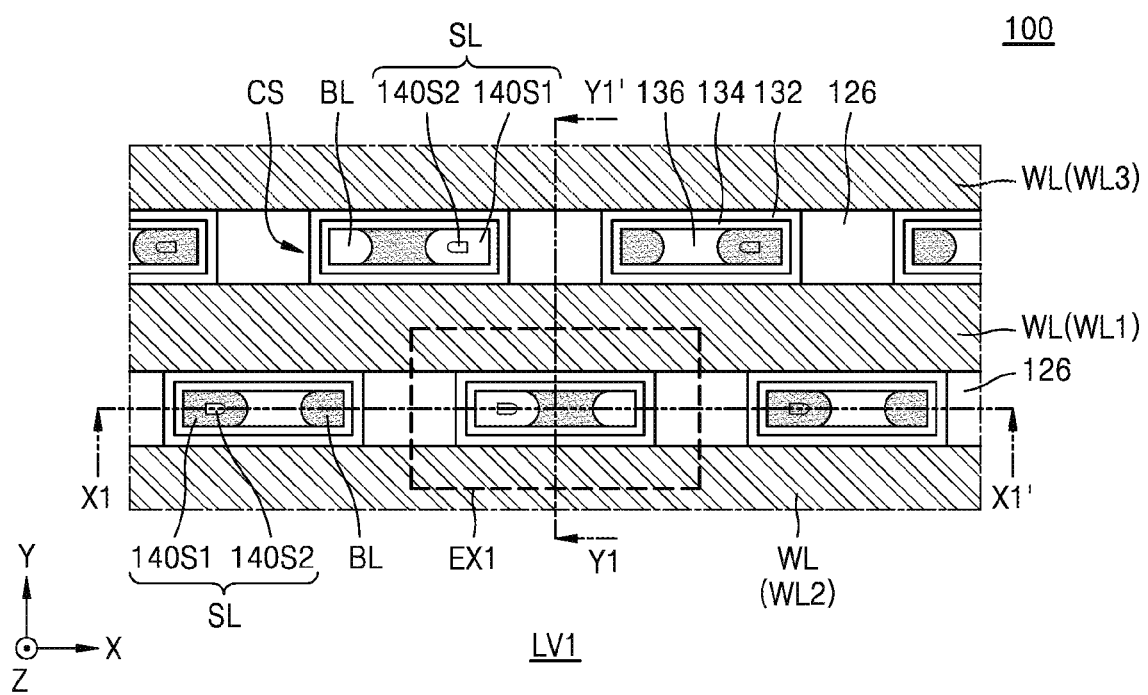
FIGS. 1A, 1B, 1C, and 1D are diagrams illustrating a three-dimensional semiconductor device according to some example embodiments, and in particular.

Hereinafter, some example embodiments of the inventive concepts will be described in detail with reference to the accompanying drawings. Like components are denoted by like reference numerals throughout the specification, and repeated descriptions thereof are omitted. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Figure 1B:
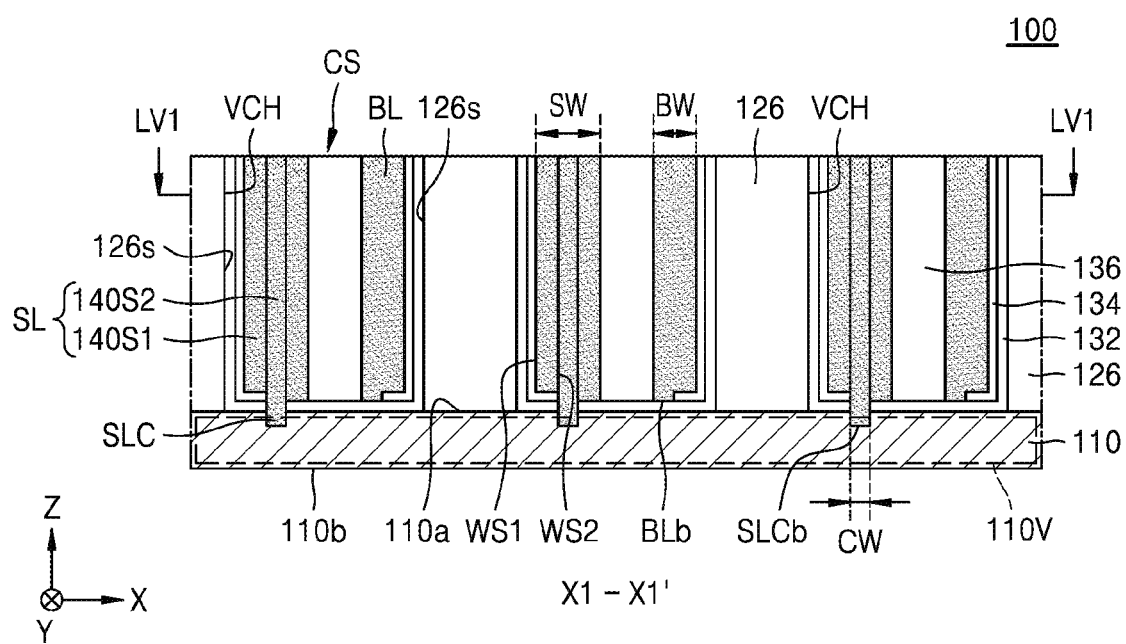
Figure 1C:
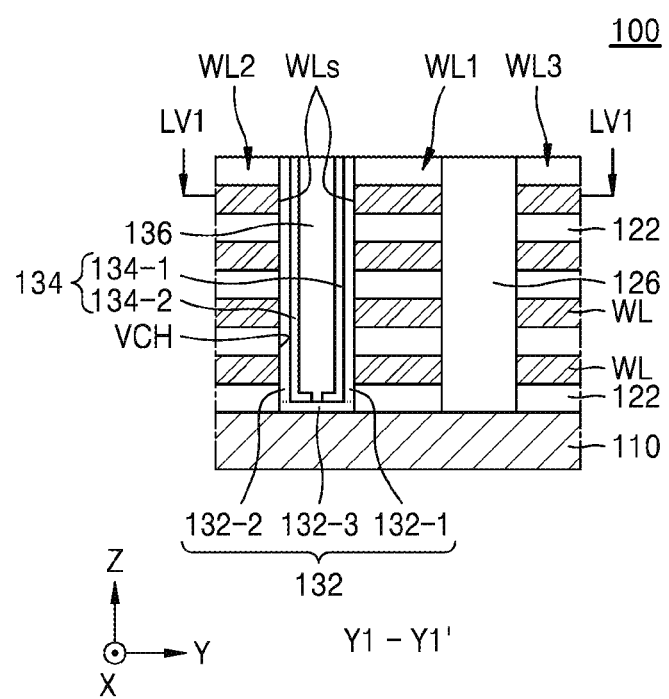
Figure 1D:
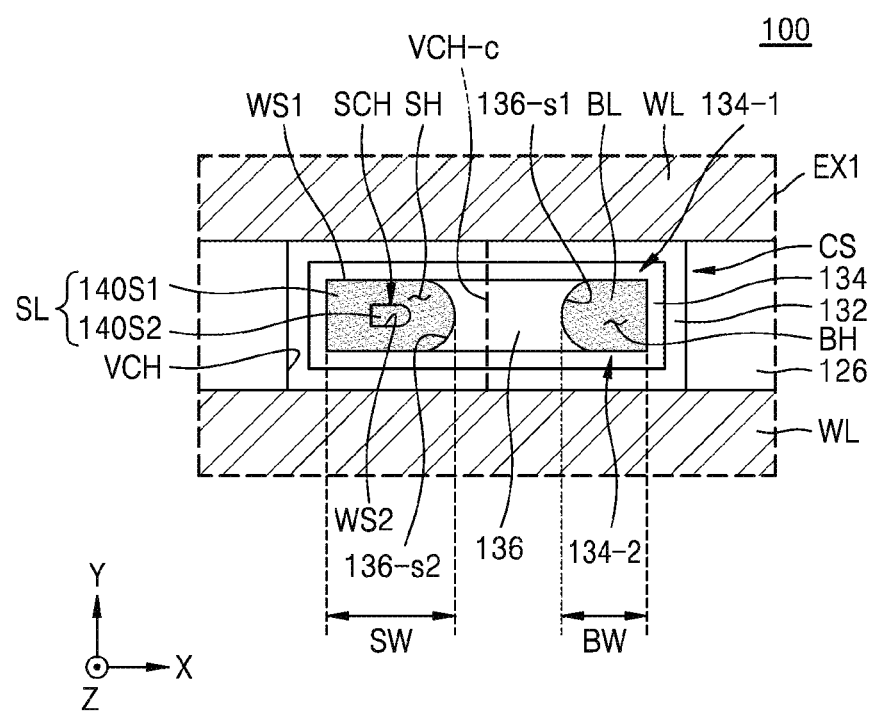

FIGS. 1A, 1B, 1C, and 1D are diagrams illustrating a three-dimensional semiconductor device 100 according to some example embodiments. More specifically, FIG. 1A is a plan view illustrating a configuration of the three-dimensional semiconductor device 100 at a first vertical level LV1 of FIGS. 1B and 1C. FIG. 1B is a cross-sectional view of the three-dimensional semiconductor device 100, taken along a line X1-X1' of FIG. 1A. FIG. 1C is a cross-sectional view of the three-dimensional semiconductor device 100, taken along a line Y1-Y1' of FIG. 1A. FIG. 1D is a partially enlarged plan view of a region EX1 of FIG. 1A.

Referring to FIGS. 1A to 1D, the three-dimensional semiconductor device 100 may include a plate common source line 110 and a plurality of word lines WL arranged over the plate common source line 110. The plurality of word lines WL may each extend lengthwise in a first horizontal direction (X direction) and may be arranged parallel to each other. In some example embodiments, the first horizontal direction (X direction) may be defined as a direction extending parallel to the plate common source line 110 and/or one or more surfaces thereof (e.g., an upper surface 110a and/or a lower surface 110b of the plate common source line 110). In some example embodiments, a second horizontal direction (Y direction) may be defined as a direction extending perpendicular to the first horizontal direction (X direction) and parallel to the plate common source line 110 and/or one or more surfaces thereof (e.g., an upper surface 110a and/or a lower surface 110b of the plate common source line 110).

The plurality of word lines WL may include a plurality of groups of word lines WL arranged over the plate common source line 110 to overlap each other in a vertical direction (Z direction). An isolation insulating film 122 may be arranged between the plurality of word lines WL overlapping each other in the vertical direction (Z direction). In some example embodiments, the vertical (Z direction) may be defined as a direction extending perpendicular to the plate common source line 110 and/or one or more surfaces thereof (e.g., an upper surface 110a and/or a lower surface 110b of the plate common source line 110). In some example embodiments, the vertical (Z direction) may be defined as a direction extending perpendicular to both the first horizontal direction (X direction) and the second horizontal direction (Y direction). A lower surface and an upper surface of each of the plurality of word lines WL may be covered by the isolation insulating film 122. The isolation insulating film 122 may include a silicon oxide film.

The plurality of word lines WL may include a plurality of first word lines WL1, a plurality of second word lines WL2, and a plurality of third word lines WL3, which are respectively arranged over different regions of the plate common source line 110. The plurality of first word lines WL1 may be arranged over a first region of the plate common source line 110 to overlap each other in the vertical direction (Z direction), the plurality of second word lines WL2 may be arranged over a second region of the plate common source line 110 to overlap each other in the vertical direction (Z direction), and the plurality of third word lines WL3 may be arranged over a third region of the plate common source line 110 to overlap each other in the vertical direction (Z direction). The first region, the second region, and the third region of the plate common source line 110, which are different regions from each other in the plate common source line 110, may be regions spaced apart from each other in a second horizontal direction (Y direction) that is perpendicular to the first horizontal direction (X direction). For example, as shown in at least FIG. 1C, separate word lines WL of separate pluralities of the first word lines WL1, the plurality of second word lines WL2, and the plurality of third word lines WL3 may be understood to be spaced apart from each other in the second horizontal direction (Y direction) such that opposing side surfaces WLs of the separate word lines WL at least partially define a vertical space VCH that is between the separate word lines WL in the second horizontal direction (Y direction). For example, as shown in at least FIG. 1C, a first word line WL1 and a second word line WL2 that overlap each other in the second horizontal direction (Y direction) may be understood to be spaced apart from each other in the second horizontal direction (Y direction) such that opposing side surfaces WLs of such horizontally overlapping first and second word lines WL1 and WL2 at least partially define a vertical space VCH that is between the separate word lines WL in the second horizontal direction (Y direction). In the second horizontal direction (Y direction), the plurality of second word lines WL2 may be arranged on an opposite side to the plurality of third word lines WL3 with the plurality of first word lines WL1 at the center thereof.

The plate common source line 110 may include, but is not limited to, doped polysilicon, Ti, TiN, Ta, TaN, W, WN, TiSiN, WSiN, polysilicon, or a combination thereof. The plurality of word lines WL may include, but are not limited to, W, Al, Cu, Co, Mo, Ti, Ta, TiN, TaN, WN, WCN, TiSiN, TaSiN, WsiN, or a combination thereof.

Insulating blocks 126, each having one or more side surfaces (e.g., opposite side surfaces 126s) at least partially defining a plurality of vertical spaces VCH, may be respectively arranged between the plurality of first word lines WL1 and the plurality of second word lines WL2 and between the plurality of first word lines WL1 and the plurality of third word lines WL3. For example, an insulating block 126 between the plurality of first word lines WL1 and the plurality of second word lines WL2 in the second horizontal direction (Y direction) may include one or more surfaces that at least partially define a vertical space VCH in the first horizontal direction (X direction), where the plurality of first word lines WL1 and the plurality of second word lines WL2 may at least partially define the vertical space VCH in the second horizontal direction (Y direction). The insulating block 126 may include, but is not limited to, a silicon oxide film.

A plurality of cell structures CS may be respectively arranged in the plurality of vertical spaces VCH. Each of the plurality of cell structures CS may include a ferroelectric layer 132 and a channel pattern 134, which are sequentially stacked on a sidewall of the insulating block 126 in the stated order and extend lengthwise in the vertical direction (Z direction) in a vertical space VCH, a bit line BL arranged in a certain region in the vertical space VCH to contact the channel pattern 134, and a source line SL arranged in another region, which is apart from the bit line BL, in the vertical space VCH to contact the channel pattern 134.

The ferroelectric layer 132 may include portions arranged between the plurality of word lines WL (for example, the plurality of first word lines WL1, the plurality of second word lines WL2, or the plurality of third word lines WL3), which partially or completely overlap each other in the vertical direction (Z direction), and the channel pattern 134. The ferroelectric layer 132 may include a portion contacting the plate common source line 110. The ferroelectric layer 132 may include portions contacting the plurality of word lines WL (for example, the plurality of first word lines WL1, the plurality of second word lines WL2, or the plurality of third word lines WL3), which overlap each other in the vertical direction (Z direction). The ferroelectric layer 132 may include a portion contacting the channel pattern 134. In the ferroelectric layer 132, the portions contacting the plurality of word lines WL, the portion contacting the channel pattern 134, and the portion contacting the plate common source line 110 may be integrally connected to each other (e.g., may be separate portions of a single, unitary piece of material extending continuously between the separate portions and are not separate pieces of material having an interface therebetween). As shown, the ferroelectric layer 132 may include a first portion 132-1 that is between (e.g., in the second horizontal direction, or Y direction) the channel pattern 134 and one or more first word lines WL1, a second portion 132-2 that is between (e.g., in the second horizontal direction, or Y direction) the channel pattern 134 and one or more second word lines WL2, and a third portion 132-3 that contacts (e.g., is contacting) the plate common source line 110. As shown, the first portion 132-1 of the ferroelectric layer 132 may contact the one or more first word lines WL1 and the second portion 132-2 of the ferroelectric layer 132 may contact the one or more second word lines WL2. The first and second portions 132-1 and 132-2 of the ferroelectric layer 132 may be integrally connected to each other, such that the first and second portions 132-1 and 132-2 of the ferroelectric layer 132 may be separate portions of a single, unitary piece of material extending continuously between the separate portions and are not separate pieces of material having an interface therebetween. The first, second, and third portions 132-1, 132-2, and 132-3 of the ferroelectric layer 132 may be integrally connected to each other, such that the first, second, and third portions 132-1, 132-2, and 132-3 of the ferroelectric layer 132 may be separate portions of a single, unitary piece of material extending continuously between the separate portions and are not separate pieces of material having an interface therebetween.

The ferroelectric layer 132 may have a cylindrical shape surrounding the bit line BL and the source line SL with the channel pattern 134 between the ferroelectric layer 132 and each of the bit line BL and the source line SL. The ferroelectric layer 132 may have a closed-loop shape when viewed in an X-Y plane. The ferroelectric layer 132 may include portions, which are apart (e.g., spaced apart) from the bit line BL and the source line SL with the channel pattern 134 therebetween, and portions respectively contacting the bit line BL and the source line SL.

The ferroelectric layer 132 may include at least one oxide selected from Hf, Si, Al, Zr, Y, La, Gd, and Sr. For example, the ferroelectric layer 132 may include a hafnium-based oxide, for example, hafnium oxide (HfO), hafnium zirconium oxide (HZO), hafnium titanium oxide, or hafnium silicon oxide. The ferroelectric layer 132 may further include a dopant as needed. The dopant may include, but is not limited to, at least one element selected from Si, Al, Zr, Y, La, Gd, Sc, Sr, Mg, and Ba. In some example embodiments, the ferroelectric layer 132 may include a stacked structure including a plurality of ferroelectric sub-layers that include different materials from each other. In some example embodiments, the ferroelectric layer 132 may include a stacked structure of at least one ferroelectric sub-layer and a dielectric layer. A constituent material of each of the plurality of ferroelectric sub-layers may be selected from the materials set forth above as examples of the constituent material of the ferroelectric layer 132. The dielectric layer may include a silicon oxide film, a high-k dielectric film, or a combination thereof. The high-k dielectric film may include a metal oxide or a metal oxynitride, which has a dielectric constant that is greater than that of a silicon oxide film.

The channel pattern 134 may include portions facing the plurality of word lines WL with the ferroelectric layer 132 therebetween. For example, the channel pattern 134 may include a first portion 134-1, which faces the plurality of first word lines WL1 with the ferroelectric layer 132 therebetween, and a second portion 134-2, which faces the plurality of second word lines WL2 with the ferroelectric layer 132 therebetween. The first portion 134-1 and the second portion 134-2 of the ferroelectric layer 132 may be integrally connected to each other.

The channel pattern 134 may have a cylindrical shape, which contacts a sidewall of each of the bit line BL and the source line SL in the vertical space VCH and surrounds the bit line BL and the source line SL. The channel pattern 134 may include portions respectively contacting the sidewalls of the bit line BL and the source line SL. For example, the first and second portions 134-1 and 134-2 may be understood to be respective portions of the channel pattern 134, each contacting a sidewall of each of the bit line BL and the source line SL. The channel pattern 134 may have a closed-loop shape when viewed in an X-Y plane.

The channel pattern 134 may include undoped polysilicon, doped polysilicon, a compound semiconductor material, an oxide semiconductor material, a two-dimensional semiconductor material, or a combination thereof.

The compound semiconductor material capable of being used for the channel pattern 134 may be selected from a Group IV-IV compound semiconductor, a Group III-V compound semiconductor, a Group II-VI compound semiconductor, and a Group IV-VI compound semiconductor. The Group IV-IV compound semiconductor may be selected from SiGe, SiC, SiGeC, GeSn, SiSn, and SiGeSn. The Group III-V compound semiconductor may include a compound semiconductor including at least one of In, Ga, and Al as a Group III element and at least one of As, P, and Sb as a Group V element. The Group III-V compound semiconductor may include a binary, ternary, or quaternary compound including two, three, or four elements selected from Group III and Group V elements. The binary compound may be selected from InP, GaAs, GaP, InAs, InSb, and GaSb, and the ternary compound may be selected from InGaP, InGaAs, AlInAs, InGaSb, GaAsSb, and GaAsP, but the inventive concepts is not limited thereto. The Group II-VI compound semiconductor may include a binary, ternary, or quaternary compound including two, three, or four elements selected from Group II and Group VI elements. The Group II-VI compound semiconductor may be selected from, but is not limited to, CdSe, ZnTe, CdS, ZnS, ZnSe, and HgCdTe. The Group IV-IV compound semiconductor may include, but is not limited to, PbS.

The oxide semiconductor material capable of being used for the channel pattern 134 may be selected from, but is not limited to, InGaZnO (IGZO), Sn-IGZO, InWO (IWO), InZnO (IZO), ZnSnO (ZTO), ZnO, yttrium-doped zinc oxide (YZO), InGaSiO (IGSO), InO, SnO, TiO, ZnON, MgZnO, ZrInZnO, HfInZnO, SnInZnO, AlSnInZnO, SiInZnO, AlZnSnO, GaZnSnO, and ZrZnSnO.

The two-dimensional semiconductor material capable of being used for the channel pattern 134 may include a transition metal dichalcogenide, or a bipolar semiconductor material that uses both an electron and a hole as a driving charge. For example, the two-dimensional semiconductor material may be selected from, but is not limited to, $MoS_2$, $MoSe_2$, $WS_2$, $NbS_2$, $TaS_2$, $ZrS_2$, $TcS_2$, $ReS_2$, $CuS_2$, $GaS_2$, $SnS_2$, $PbS_2$, $WSe_2$, $NbSe_2$, $TaSe_2$, $ZrSe_2$, $HfSe_2$, $TeSe_2$, $ReSe_2$, $CuSe_2$, $GaSe_2$, $InSe_2$, $SnSe_2$, $PbSe_2$, $MoTe_2$, $WTe_2$, $NbTe_2$, $TaTe_2$, $ZrTe_2$, $HfTe_2$, $TcTe_2$, $ReTe_2$, $CuTe_2$, $GaTe_2$, $InTe_2$, $SnTe_2$, $GeTe_2$, and $PbTe_2$.

Herein, each of the materials listed above refers to a material including elements included in each term and is not a chemical formula representing a stoichiometric relationship.

In each of the plurality of cell structures CS respectively arranged in the plurality of vertical spaces VCH, the bit line BL may have a first width BW in the first horizontal direction (X direction), and an upper portion of the source line SL may have a second width SW, which is greater than the first width BW of the bit line BL, in the first horizontal direction (X direction). The source line SL may have a source line contact portion SLC extending to an inside of the plate common source line 110 (e.g., extends into a portion of a volume space 110V at least partially defined by the outermost, upper and lower surfaces 110a and 110b of the plate common source line 110, such that at least a portion of the source line contact portion SLC is located within such volume space 110V and such that the bottom surface SLCb of the source line contact portion SLC is closer to the lower surface 110b of the plate common source line 110 in the vertical direction (Z direction) than the upper surface 110a of the plate common source line 110) through the ferroelectric layer 132. In the first horizontal direction (X direction), the width CW of the source line contact portion SLC may be equal to or less than a difference between the second width SW of the upper portion of the source line SL and the first width BW of the bit line BL. That is, in the first horizontal direction (X direction), the second width SW of the upper portion of the source line SL may be equal to or greater than a sum of the first width BW of the bit line BL and the width CW of the source line contact portion SLC.

As shown in FIG. 1B, a lowermost surface BLb of the bit line BL (e.g., a surface of the bit line BL which is closest to the plate common source line 110 and/or an upper surface 110a and/or lower surface 110b thereof in the vertical direction (Z direction)) may contact the ferroelectric layer 132, and a lowermost surface of the source line SL may contact the plate common source line 110. The bit line BL may be apart (e.g., spaced apart) from the plate common source line 110 in the vertical direction (Z direction) with the ferroelectric layer 132 therebetween. A vertical level of the lowermost surface of the bit line BL may be higher than a vertical level of an upper surface 110a of the plate common source line 110.

In the present specification, the term 'level', 'vertical level', 'depth', 'height', or the like may mean a vertical height (e.g., vertical distance in the vertical direction (Z direction)) measured from a reference location (e.g., the upper surface 110a or the lower surface 110b of the plate common source line 110) in a direction perpendicular to the plane or surface at the reference location (e.g., the vertical direction (Z direction)). For example, where elements (e.g., surfaces) are described herein to be at different vertical levels, it will be understood that the respective distances of the elements from the reference location (e.g., the upper surface 110a or the lower surface 110b of the plate common source line 110) in the vertical direction (Z direction) may be different from each other. In another example, where a vertical level of a first element is described herein to be between at least two other elements, it will be understood that the first element is between the at least two other elements in the vertical direction. In another example, where a vertical level of a first element is described herein to be lower, less, or smaller than a vertical level of a second element, it will be understood that the distance of the first element from the reference location (e.g., the upper surface 110a or the lower surface 110b of the plate common source line 110) in the vertical direction may be smaller than the distance of the second element from the reference location in the vertical direction. In another example, where a vertical level of a first element is described herein to be higher, larger, or greater than a vertical level of a second element, it will be understood that the distance of the first element from the reference location (e.g., the upper surface 110a or the lower surface 110b of the plate common source line 110) in the vertical direction may be greater than the distance of the second element from the reference location in the vertical direction. In another example, where a vertical level of a first element is described herein to be the same or substantially the same as a vertical level of a second element or "at" the level of the second element, it will be understood that the distance of the first element from the reference location (e.g., the upper surface 110a or the lower surface 110b of the plate common source line 110) in the vertical direction may be the same or substantially the same as the distance of the second element from the reference location in the vertical direction. In some example embodiments, a "lowermost" surface or portion of an element may be understood to be the surface or portion of the element that is closest to the reference location (e.g., the upper surface 110a or the lower surface 110b of the plate common source line 110) in the vertical direction (Z direction). In some example embodiments, an "uppermost" surface or portion of an element may be understood to be the surface or portion of the element that is furthest from the reference location (e.g., the upper surface 110a or the lower surface 110b of the plate common source line 110) in the vertical direction (Z direction).

In the first horizontal direction (X direction), the width CW of the source line contact portion SLC included in the source line SL may be less (e.g., smaller) than the widths of other portions of the source line SL (e.g., smaller than respective widths of other portions of the source line SL). For example, in the first horizontal direction (X direction), the width CW of the source line contact portion SLC may be less (e.g., smaller) than the width of a portion of the source line SL, which faces the bit line BL in the first horizontal direction (X direction). A vertical level of a lowermost surface of the source line contact portion SLC may be lower than the vertical level of the upper surface 110a of the plate common source line 110.

As shown in FIGS. 1A, 1B, and 1D, the source line SL may include an outer source line 140S1 having a pipe shape, and an inner source line 140S2 surrounded by the outer source line 140S1. The outer source line 140S1 may have an outer wall WS1 contacting the channel pattern 134, and an inner wall WS2 defining a center hole (for example, a center hole SCH shown in FIGS. 1D, 13A, and 13B). The inner source line 140S2 may fill the center hole defined by the outer source line 140S1 and contact, in the center hole, the outer source line 140S1. The inner source line 140S2 may have the source line contact portion SLC. Respective upper surfaces of the outer source line 140S1 and the inner source line 140S2 may be at the same level over the plate common source line 110.

Each of the bit line BL and the source line SL may include a metal, a conductive metal nitride, a conductive semiconductor material, or a combination thereof. In some example embodiments, each of the bit line BL and the source line SL may include, but is not limited to, W, Al, Cu, Co, Mo, Ti, Ta, TiN, TaN, WN, WCN, TiSiN, TaSiN, WSiN, or a combination thereof.

In some example embodiments, the outer source line 140S1 and the inner source line 140S2 included in the source line SL may include the same material. In some example embodiments, the outer source line 140S1 and the inner source line 140S2 included in the source line SL may include different materials from each other.

An insulating plug 136 may be arranged between the bit line BL and the source line SL in the vertical space VCH. The insulating plug 136 may be arranged eccentrically (e.g., asymmetrically) to one side in the first horizontal direction (X direction) from the center VCH-c of the vertical space VCH in the first horizontal direction (X direction), for example such that the respective smallest distances in the first horizontal direction from the center VCH-c of the vertical space VCH to opposite sides 136-s1, 136-s2 of the insulating plug 136 are different from each other, such that spaces on both sides of the insulating plug 136 in the vertical space VCH (e.g., separate, respective spaces that may define separate, respective source line and bit line holes SH, BH within the vertical space VCH that are at least partially defined by separate, respective opposite sides 136-s1, 136-s2 of the insulating plug 136 within the vertical space VCH) have different volumes from each other. The insulating plug 136 may include, but is not limited to, a silicon oxide film.

In one vertical space VCH, one bit line BL, one source line SL, and one insulating plug 136 between the one bit line BL and the one source line SL may be surrounded by one channel pattern 134. The insulating plug 136 may include portions contacting the channel pattern 134.

In one vertical space VCH, one bit line BL, one source line SL, and one insulating plug 136 between the one bit line BL and the one source line SL may be surrounded by one ferroelectric layer 132. In the one vertical space VCH, the one bit line BL, the one source line SL, and the one insulating plug 136 may be apart from the one ferroelectric layer 132 with the channel pattern 134 therebetween.

As shown in FIG. 1A, the plurality of cell structures CS may include two cell structures CS, which are arranged apart from each other in the second horizontal direction (Y direction) while the plurality of word lines WL (for example, the plurality of first word lines WL1) overlapping each other in the vertical direction (Z direction) are therebetween, and which face each other in the second horizontal direction (Y direction), and the two cell structures CS may be arranged eccentrically in opposite directions to each other in the first horizontal direction (X direction) from a straight line extending in the second horizontal direction (Y direction). The two cell structures CS may be point-symmetric to each other with respect to one point on the straight line extending in the second horizontal direction (Y direction).

Figure 2A:
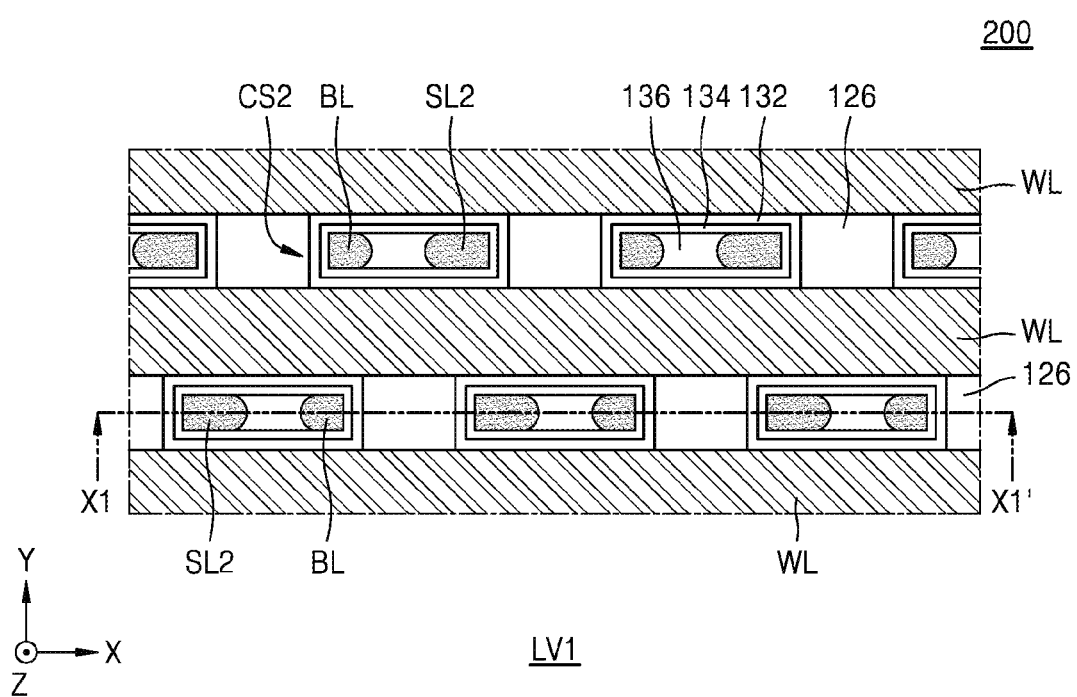
FIGS. 2A and 2B are diagrams illustrating a three-dimensional semiconductor device according to some example embodiments, and in particular.
Figure 2B:
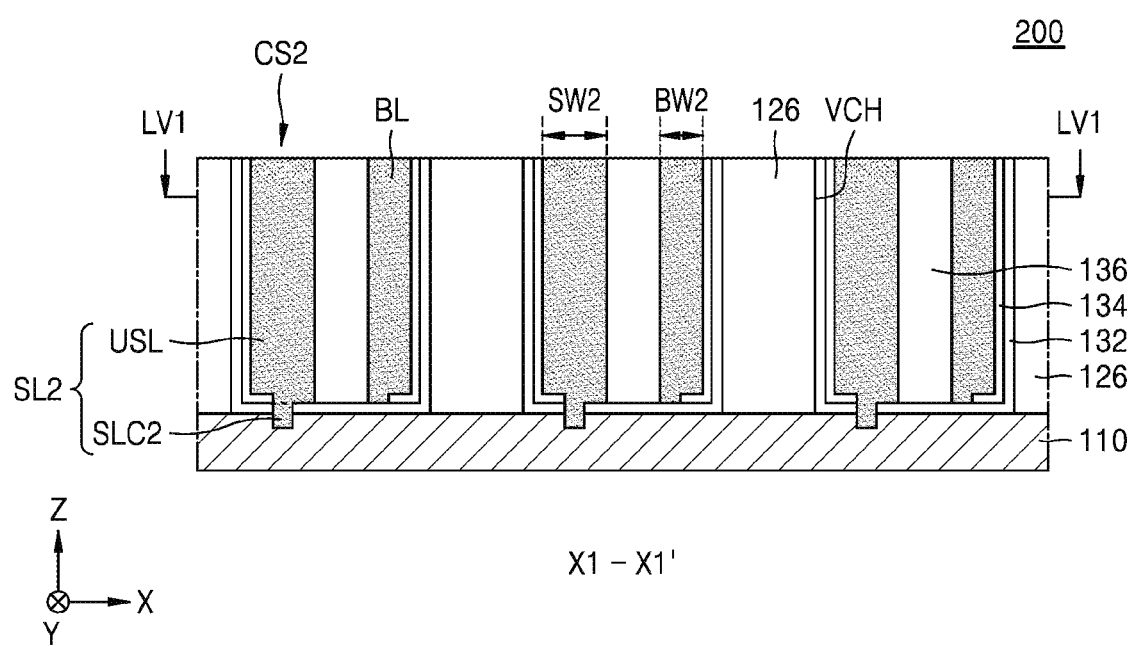

FIGS. 2A and 2B are diagrams illustrating a three-dimensional semiconductor device 200 according to some example embodiments. More specifically, FIG. 2A is a plan view illustrating a configuration of the three-dimensional semiconductor device 200 at a first vertical level LV1 of FIG. 2B. FIG. 2B is a cross-sectional view of the three-dimensional semiconductor device 200, taken along the line X1-X1' of FIG. 2A. In FIGS. 2A and 2B, the same reference numerals as in FIGS. 1A to 1D respectively denote the same members, and here, repeated descriptions thereof are omitted.

Referring to FIGS. 2A and 2B, the three-dimensional semiconductor device 200 may have substantially the same configuration as the three-dimensional semiconductor device 100 described with reference to FIGS. 1A to 1D. However, the three-dimensional semiconductor device 200 includes a source line SL2 arranged singly in each of the plurality of vertical spaces VCH defined by the insulating block 126.

The source line SL2 may include a source line contact portion SLC2 extending to the inside of the plate common source line 110 through the ferroelectric layer 132, and a source line upper portion USL, which has a cylindrical structure and is arranged at a higher vertical level than the upper surface 110a of the plate common source line 110 and integrally connected to the source line contact portion SLC2.

In the first horizontal direction (X direction), the source line upper portion USL may have a width that is greater than the width of the source line contact portion SLC2. A vertical level of a lowermost surface of the source line contact portion SLC2 may be lower than the vertical level of the upper surface 110a of the plate common source line 110. In each of the plurality of cell structures CS respectively arranged in the plurality of vertical spaces VCH, the bit line BL may have a first width BW2 in the first horizontal direction (X direction), and an upper portion of the source line SL2 may have a second width SW2, which is greater than the first width BW2 of the bit line BL, in the first horizontal direction (X direction). A more detailed configuration of the source line SL2 is substantially the same as described regarding the source line SL with reference to FIGS. 1A to 1D.

Figure 3:
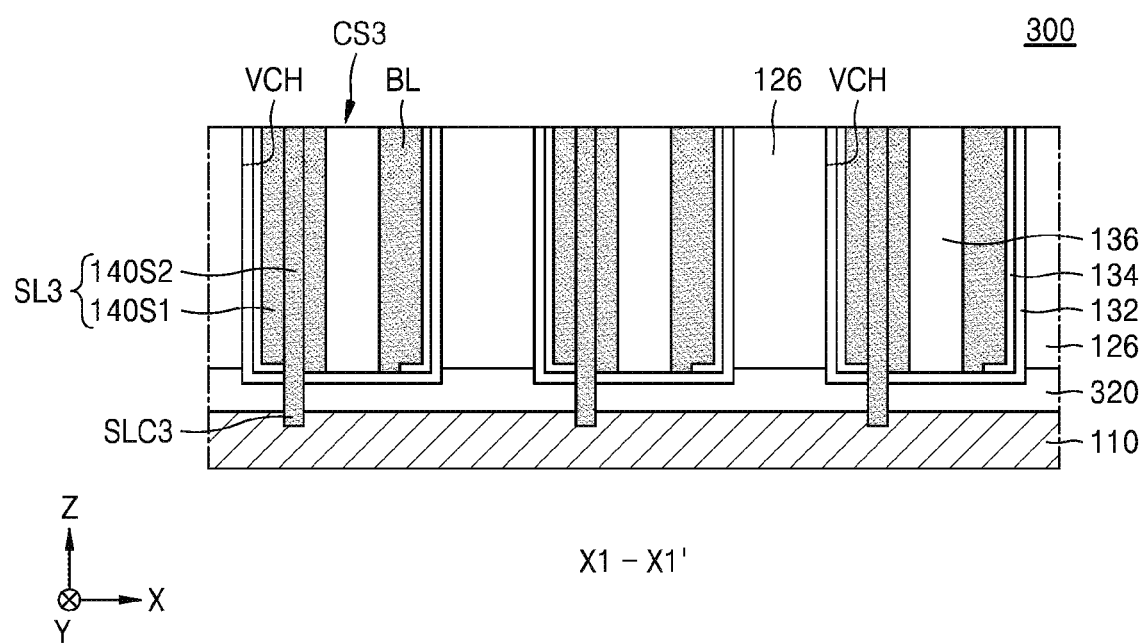
FIG. 3 is a cross-sectional view illustrating a three-dimensional semiconductor device according to some example embodiments.

FIG. 3 is a cross-sectional view illustrating a three-dimensional semiconductor device 300 according to some example embodiments. FIG. 3 illustrates components in a cross-section corresponding to the cross-section taken along the line X1-X1' of FIG. 1A. In FIG. 3, the same reference numerals as in FIGS. 1A to 1D respectively denote the same members, and here, repeated descriptions thereof are omitted.

Referring to FIG. 3, the three-dimensional semiconductor device 300 may have substantially the same configuration as the three-dimensional semiconductor device 100 described with reference to FIGS. 1A to 1D. However, the three-dimensional semiconductor device 300 further includes a buffer insulating layer 320 between the plate common source line 110 and the ferroelectric layer 132. The buffer insulating layer 320 may include, but is not limited to, hafnium oxide, silicon nitride, or a combination thereof.

In the three-dimensional semiconductor device 300, a cell structure CS3 arranged singly in each of the plurality of vertical spaces VCH defined by the insulating block 126 includes a source line SL3. Similar to the description made regarding the source line SL with reference to FIGS. 1A to 1D, the source line SL3 may include the outer source line 140S1, and the inner source line 140S2 surrounded by the outer source line 140S1. The inner source line 140S2 may have a source line contact portion SLC3. The source line contact portion SLC3 may pass (e.g., extend) through the ferroelectric layer 132 and the buffer insulating layer 320 in the vertical direction (Z direction) and extend to the inside of the plate common source line 110. A vertical level of a lowermost surface of the source line contact portion SLC3 may be lower than the vertical level of the upper surface 110a of the plate common source line 110. A more detailed configuration of the source line SL3 is substantially the same as described regarding the source line SL with reference to FIGS. 1A to 1D.

Figure 4:
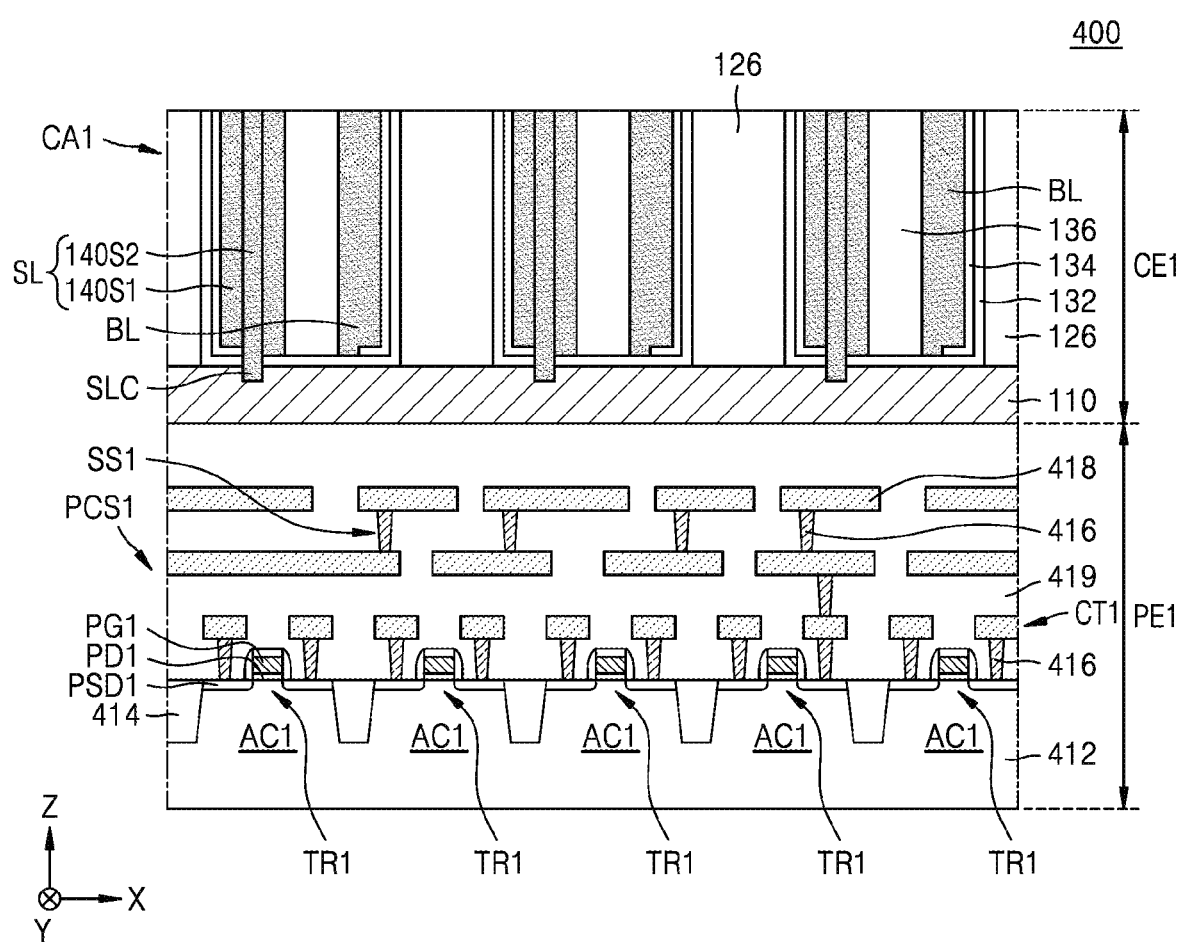
FIG. 4 is a cross-sectional view illustrating a three-dimensional semiconductor device according to some example embodiments.

FIG. 4 is a cross-sectional view illustrating a three-dimensional semiconductor device 400 according to some example embodiments. In FIG. 4, the same reference numerals as in FIGS. 1A to 1D respectively denote the same members, and here, repeated descriptions thereof are omitted.

Referring to FIG. 4, the three-dimensional semiconductor device 400 may include a peripheral circuit area PE1 and a cell area CE1 on the peripheral circuit area PE1.

The peripheral circuit area PE1 may include a substrate 412 and a peripheral circuit structure PCS1 on the substrate 412. The peripheral circuit structure PCS1 may include a plurality of transistors TR1 and a plurality of wiring structures SS1 respectively connected to the plurality of transistors TR1.

The cell area CE1 may include a cell array CA1 arranged to overlap the peripheral circuit area PE1 in the vertical direction (Z direction). The cell area CE1 may have substantially the same configuration as described regarding the three-dimensional semiconductor device 100 with reference to FIGS. 1A to 1D. However, the plate common source line 110 may be formed on the peripheral circuit structure PCS1 to cover the peripheral circuit structure PCS1, such that the plate common source line 110 covers the peripheral circuit structure PCS1.

The peripheral circuit area PE1 may include a plurality of circuits CT1 formed over the substrate 412. The plurality of circuits CT1 may be arranged between the substrate 412 and the cell area CE1. The substrate 412 may include a semiconductor material, for example, a Group IV semiconductor material, a Group III-V compound semiconductor material, or a Group II-VI compound semiconductor material. In some example embodiments, the plurality of circuits CT1 may include a row decoder, a page buffer, a data input-output circuit, control logic, a common source line driver, and the like. In some example embodiments, the plurality of circuits CT1 may further include unit devices, such as a resistor, a capacitor, and the like.

A device isolation film 414 may be arranged in the substrate 412 to define a plurality of active regions AC1. The plurality of transistors TR1 may be respectively formed on the plurality of active regions AC1, and a plurality of conductive plugs 416 and a plurality of conductive lines 418 may be arranged on the substrate 412 and the plurality of transistors TR1. The plurality of conductive plugs 416 and the plurality of conductive lines 418 may constitute a wiring structure SS1 of the peripheral circuit area PE1.

Each of the plurality of transistors TR1 may include a gate dielectric film PD1, a gate electrode PG1, and a pair of source/drain regions PSD1. Each of the plurality of conductive plugs 416 may make a connection of some selected from among the plurality of transistors TR1 and the plurality of conductive lines 418 in the vertical direction (Z direction). An interlayer dielectric 419 may cover the plurality of transistors TR1, the plurality of conductive plugs 416, and the plurality of conductive lines 418.

In some example embodiments, each of the plurality of conductive plugs 416 and the plurality of conductive lines 418 in the peripheral circuit area PE1 may include, but is not limited to, W, Al, Cu, or a combination thereof. The device isolation film 414 may include a silicon oxide film, a silicon nitride film, or a combination thereof. The interlayer dielectric 419 may include a silicon oxide film, a silicon nitride film, or a combination thereof.

The plurality of transistors TR1, the plurality of conductive plugs 416, and the plurality of conductive lines 418 may each constitute some of the plurality of circuits CT1 formed in the peripheral circuit area PE1. Each of the plurality of transistors TR1 may be configured to be electrically connected to the cell area CE1 through a wiring structure SS1 of the peripheral circuit area PE1.

Figure 5:
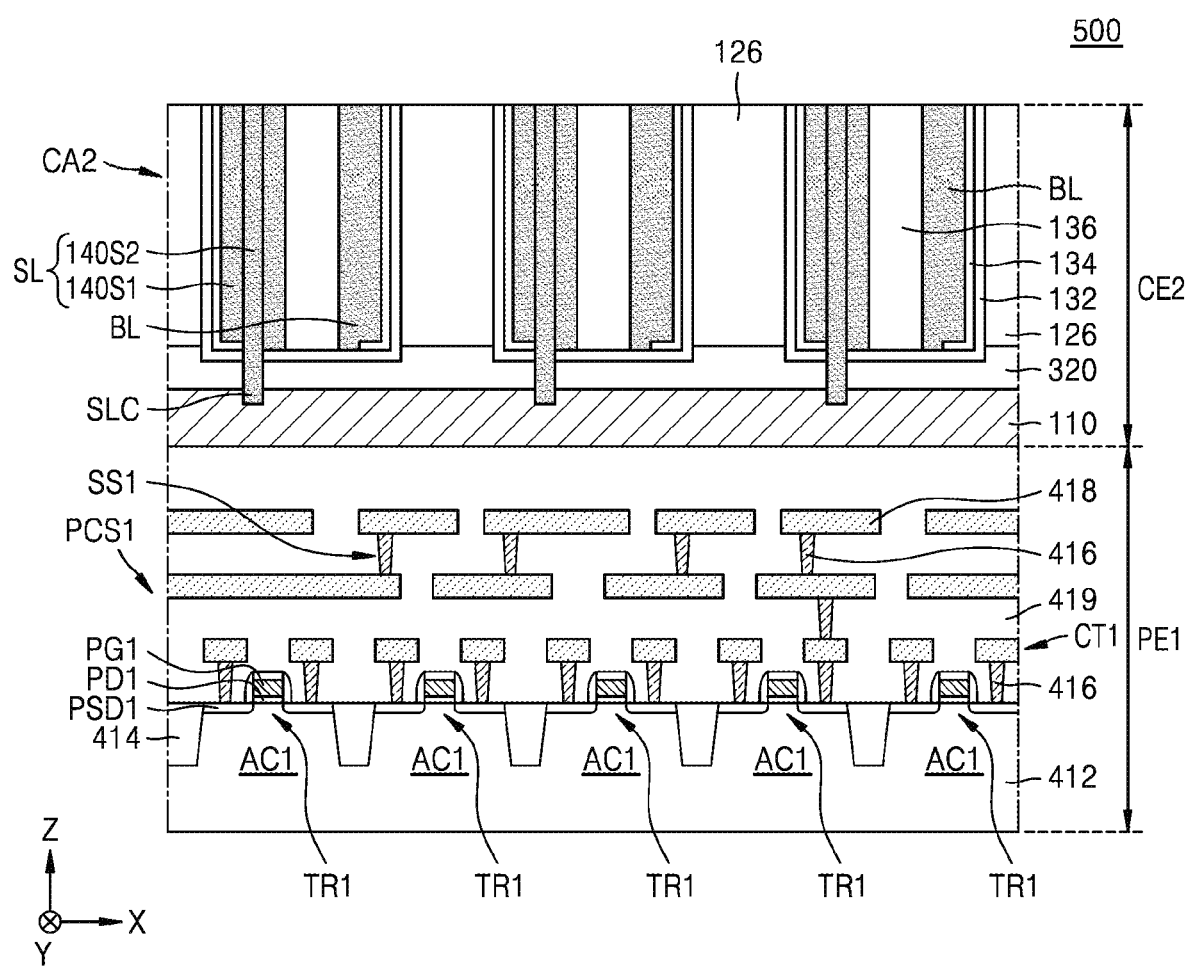
FIG. 5 is a cross-sectional view illustrating a three-dimensional semiconductor device according to some example embodiments.

FIG. 5 is a cross-sectional view illustrating a three-dimensional semiconductor device 500 according to some example embodiments. In FIG. 5, the same reference numerals as in FIGS. 1A to 1D respectively denote the same members, and here, repeated descriptions thereof are omitted.

Referring to FIG. 5, the three-dimensional semiconductor device 500 may have substantially the same configuration as described regarding the three-dimensional semiconductor device 400 with reference to FIG. 4. However, the three-dimensional semiconductor device 500 may include a cell area CE2 on the peripheral circuit area PE1. The cell area CE2 may include a cell array CA2 arranged to overlap the peripheral circuit area PE1 in the vertical direction (Z direction). The cell array CA2 may have substantially the same configuration as described regarding the three-dimensional semiconductor device 300 with reference to FIG. 3.

Figure 6:
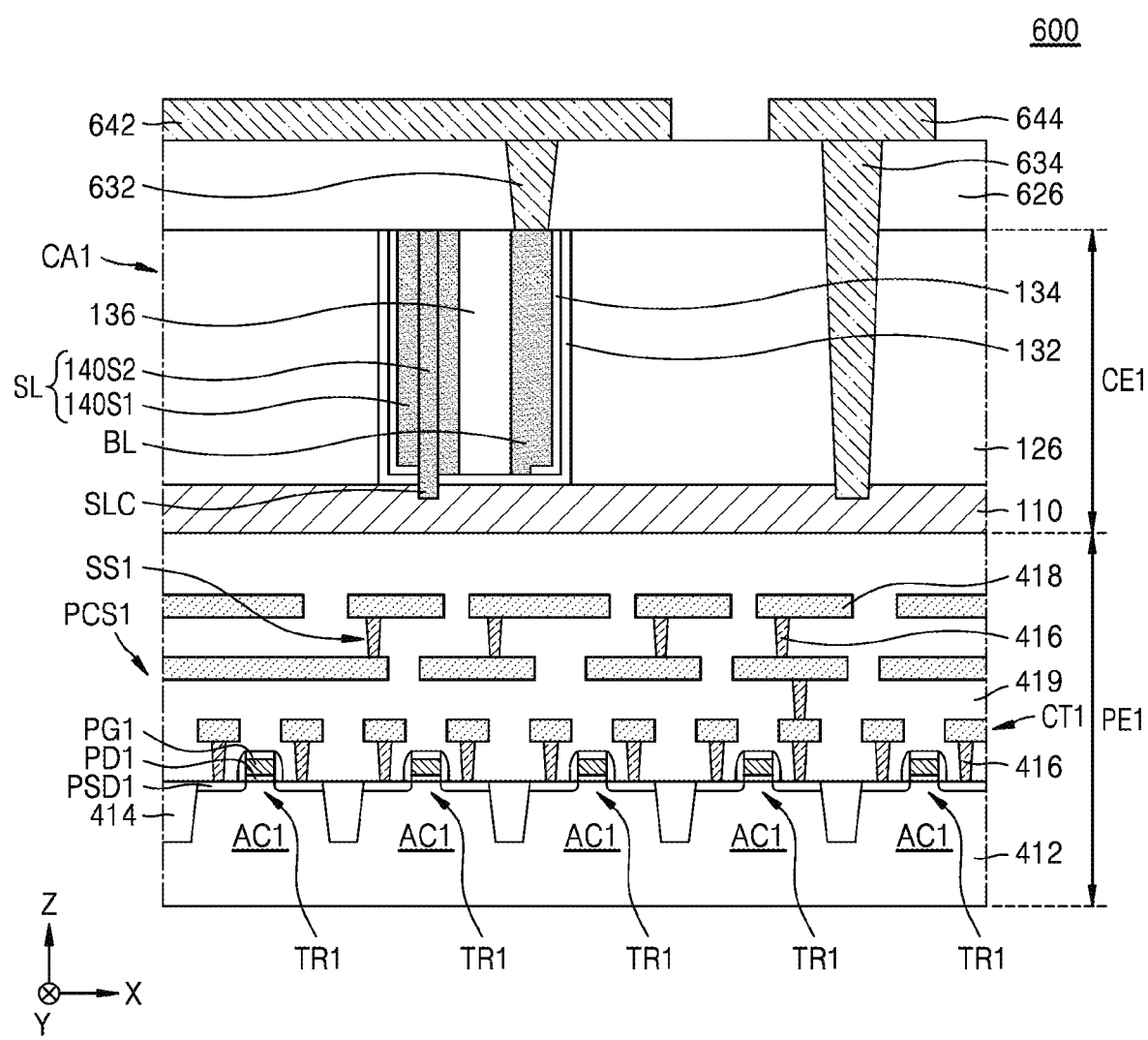
FIG. 6 is a cross-sectional view illustrating a three-dimensional semiconductor device according to some example embodiments.

FIG. 6 is a cross-sectional view illustrating a three-dimensional semiconductor device 600 according to some example embodiments. In FIG. 6, the same reference numerals as in FIGS. 1A to 1D and 4 respectively denote the same members, and here, repeated descriptions thereof are omitted.

Referring to FIG. 6, the three-dimensional semiconductor device 600 may have substantially the same configuration as described regarding the three-dimensional semiconductor device 400 with reference to FIG. 4. However, the three-dimensional semiconductor device 600 may further include an interlayer dielectric 626 covering an upper surface of each of the bit line BL and the source line SL, a bit line contact plug 632 passing through the interlayer dielectric 626 in the vertical direction (Z direction) to contact the upper surface of the bit line BL, a source line contact plug 634 passing through the interlayer dielectric 626 and the insulating block 126 in the vertical direction (Z direction) to contact the plate common source line 110, a first conductive line 642 arranged on the interlayer dielectric 626 and connected to the bit line contact plug 632, and a second conductive line 644 arranged on the interlayer dielectric 626 to be apart from the first conductive line 642 and connected to the source line contact plug 634. The upper surface of the source line SL may be completely covered by the interlayer dielectric 626. A wiring line may not be connected to the upper surface of the source line SL.

The interlayer dielectric 626 may include a silicon oxide film. Each of the bit line contact plug 632, the source line contact plug 634, the first conductive line 642, and the second conductive line 644 may include, but is not limited to, W, Al, Cu, Co, Mo, Ti, Ta, TiN, TaN, WN, WCN, TiSiN, TaSiN, WSiN, or a combination thereof.

The three-dimensional semiconductor device 600 shown in FIG. 6 has a structure in which the source line SL is connected to the second conductive line 644 on the interlayer dielectric 626 via the plate common source line 110 and the source line contact plug 634. Therefore, even when the cell array CA1 of the three-dimensional semiconductor device 600 is fine-sized and highly integrated and the pitch of a plurality of cells in the cell array CA1 is reduced, the difficulty of a process of forming the bit line contact plug 632 and the first conductive line 642, which are connected to the bit line BL, may be reduced.

Each of the three-dimensional semiconductor devices 100, 200, 300, 400, 500, and 600 described with reference to FIGS. 1A to 6 may include the source line SL, SL2, or SL3 having a width that is greater than the width of the bit line BL in each of the plurality of cell structures CS, CS2, or CS3, and the source lines SL, SL2, and SL3 may respectively have the source line contact portions SLC, SLC2, and SLC3 extending to the inside of the plate common source line 110 through the ferroelectric layer 132. According to the three-dimensional semiconductor devices 100, 200, 300, 400, 500, and 600 having such structures, in forming the bit line BL and the source line SL, SL2, or SL3, which are shared by ferroelectric transistors overlapping each other in the vertical direction (Z direction), there is an advantageous effect in electrically isolating the bit line and the source line from each other by a simplified process without an increase in process cost. Therefore, each of the three-dimensional semiconductor devices 100, 200, 300, 400, 500, and 600 according to the inventive concepts has an advantageous structure in causing a cell array with a three-dimensional structure to be fine-sized and highly integrated, and may have improved reliability and an improved degree of integration even when the number of stacked cells overlapping each other in the vertical direction (Z direction) in the cell array increases.

Next, an example of a method of fabricating a three-dimensional semiconductor device according to some example embodiments will be described in detail.

FIGS. 7A, 7B, 7C, 8A, 8B, 8C, 9A, 9B, 9C, 10A, 10B, 10C, 11A, 11B, 11C, 12A, 12B, 13A, 13B, 14A, and 14B are diagrams respectively illustrating a sequence of processes of a method of fabricating a three-dimensional semiconductor device, according to some example embodiments. In particular, FIGS. 7A, 8A, 9A, 10A, 11A, 12A, 13A, and 14A are plan views illustrating the method of fabricating a three-dimensional semiconductor device according to the sequence of processes, respectively. FIGS. 7B, 8B, 9B, 10B, 11B, 12B, 13B, and 14B are cross-sectional views taken along the line X1-X1' of FIGS. 7A, 8A, 9A, 10A, 11A, 12A, 13A, and 14A, respectively. FIGS. 7C, 8C, 9C, 10C, and 11C are cross-sectional views taken along the line Y1-Y1' of FIGS. 7A, 8A, 9A, 10A, and 11A, respectively. An example of a method of fabricating the three-dimensional semiconductor device 100 shown in FIGS. 1A to 1D will be described with reference to FIGS. 7A to 14B. In FIGS. 7A to 14B, the same reference numerals as in FIGS. 1A to 1D and 4 respectively denote the same members, and here, repeated descriptions thereof are omitted.

Figure 7A:
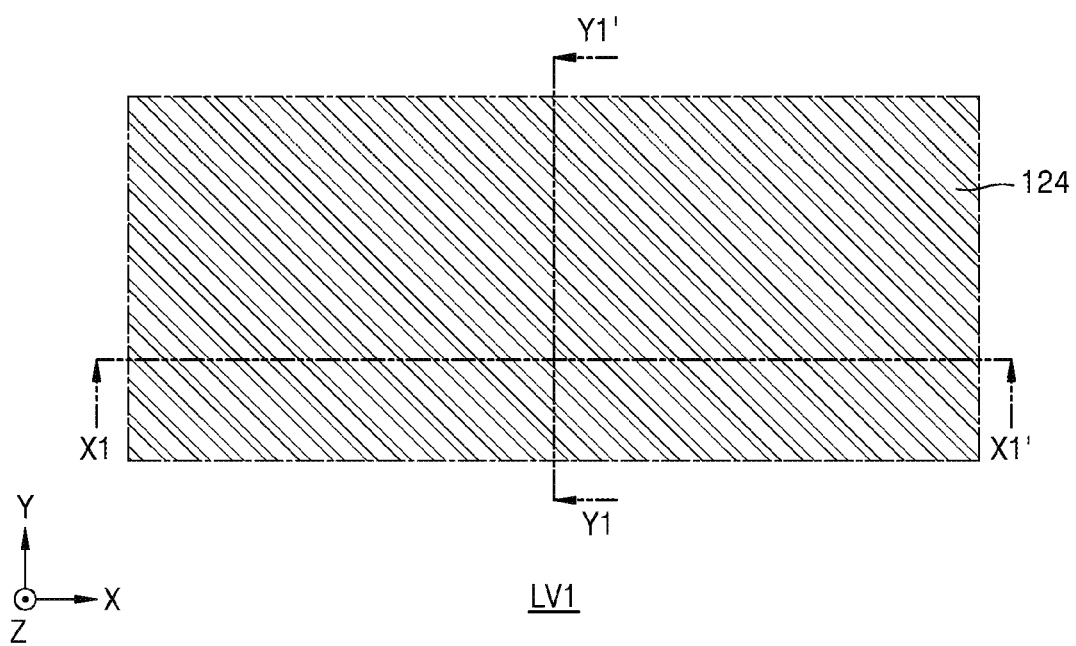
FIGS. 7A, 7B, 7C, 8A, 8B, 8C, 9A, 9B, 9C, 10A, 10B, 10C, 11A, 11B, 11C, 12A, 12B, 13A, 13B, 14A, and 14B are diagrams respectively illustrating a sequence of processes of a method of fabricating a three-dimensional semiconductor device, according to some example embodiments, and in particular.
Figure 7B:
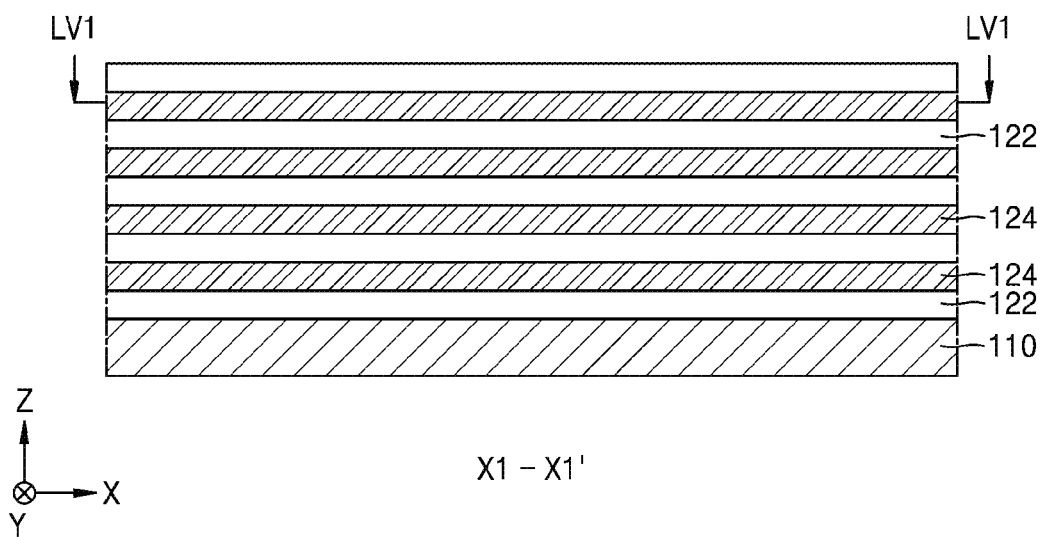
Figure 7C:
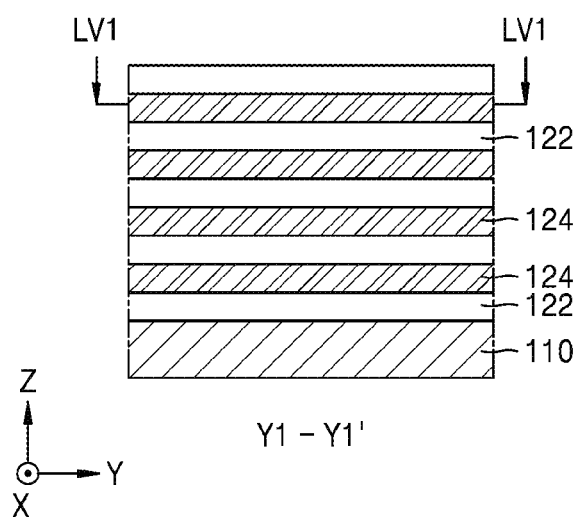

Referring to FIGS. 7A, 7B, and 7C, a plurality of isolation insulating films 122 and a plurality of conductive layers 124 may be alternately stacked one-by-one on the plate common source line 110.

Each of the plurality of isolation insulating films 122 may include a silicon oxide film. Each of the plurality of conductive layers 124 may include W, Al, Cu, Co, Mo, Ti, Ta, TiN, TaN, WN, WCN, TiSiN, TaSiN, WSiN, or a combination thereof.

Figure 8A:
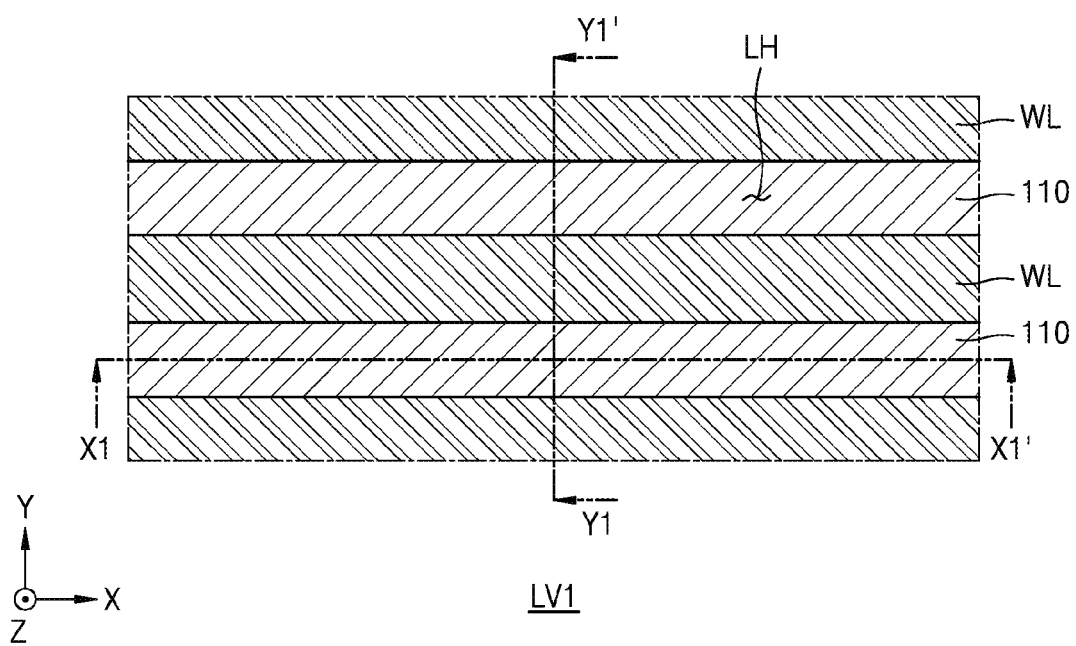
Figure 8B:
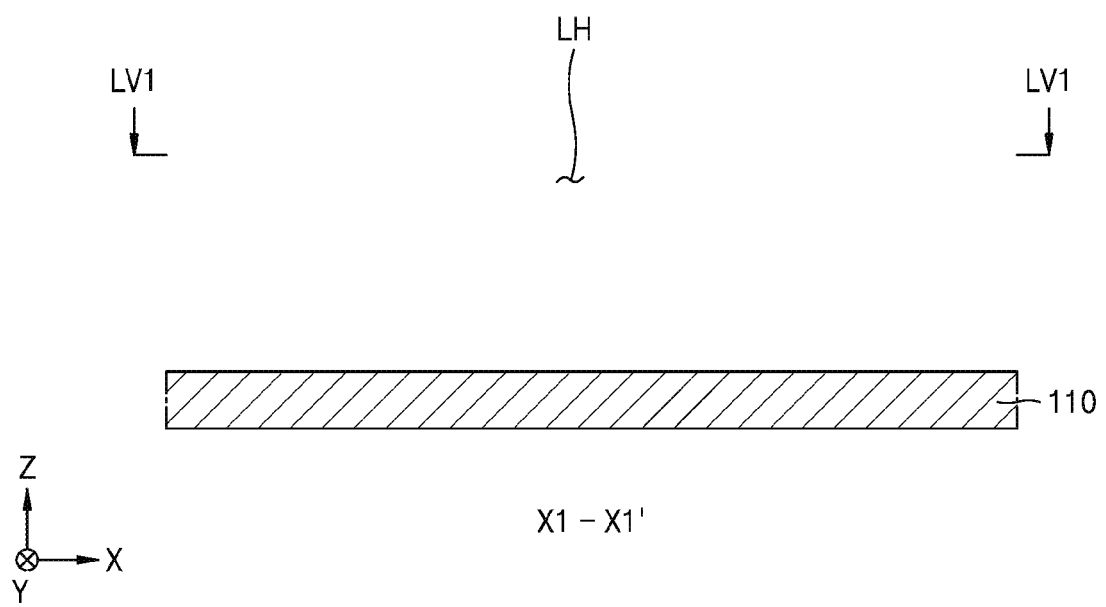
Figure 8C:
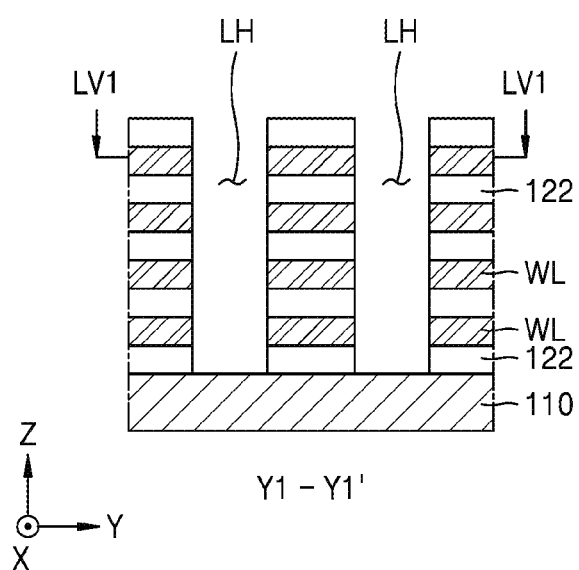

Referring to FIGS. 8A, 8B, and 8C, some regions of a stacked structure of the plurality of isolation insulating films 122 and the plurality of conductive layers 124 may be removed from a resulting product of FIGS. 7A, 7B, and 7C by etching, thereby forming a plurality of line holes LH. As the plurality of line holes LH are formed, the plurality of word lines WL may be obtained from the plurality of conductive layers 124. The upper surface of the plate common source line 110 may be exposed at a bottom of each of the plurality of line holes LH.

Figure 9A:
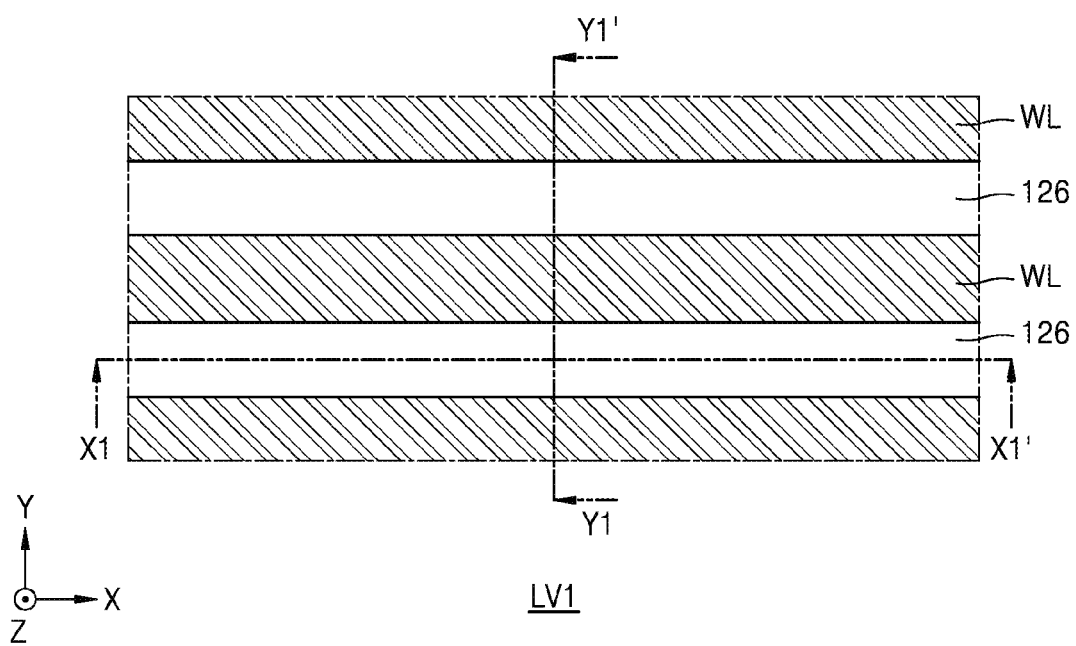
Figure 9B:
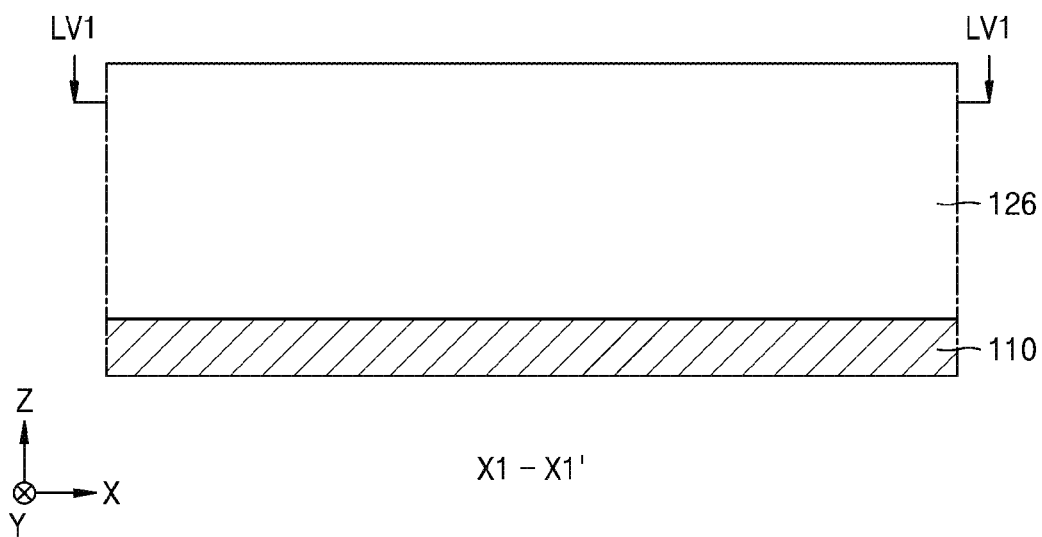
Figure 9C:
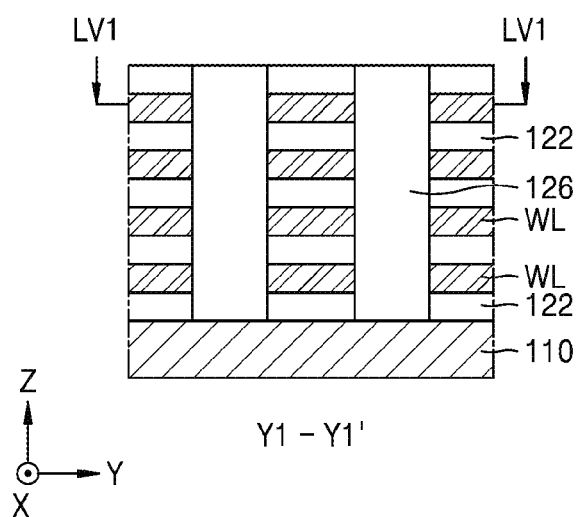

Referring to FIGS. 9A, 9B, and 9C, in a resulting product of FIGS. 8A, 8B, and 8C, a plurality of insulating blocks 126 may be formed to respectively fill the plurality of line holes LH.

Figure 10A:
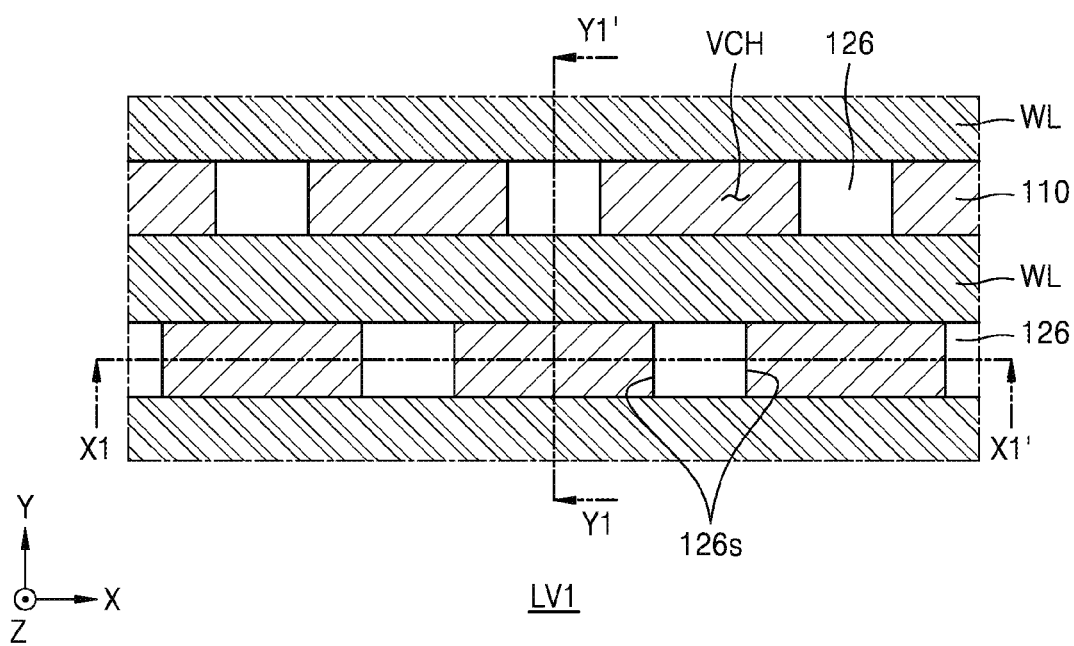
Figure 10B:
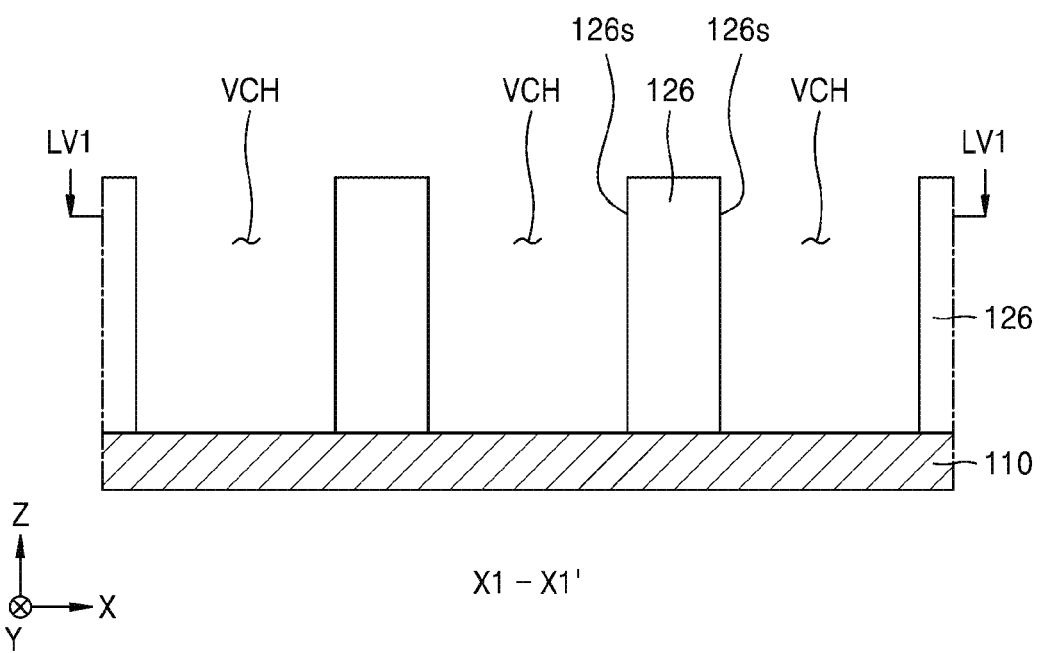
Figure 10C:
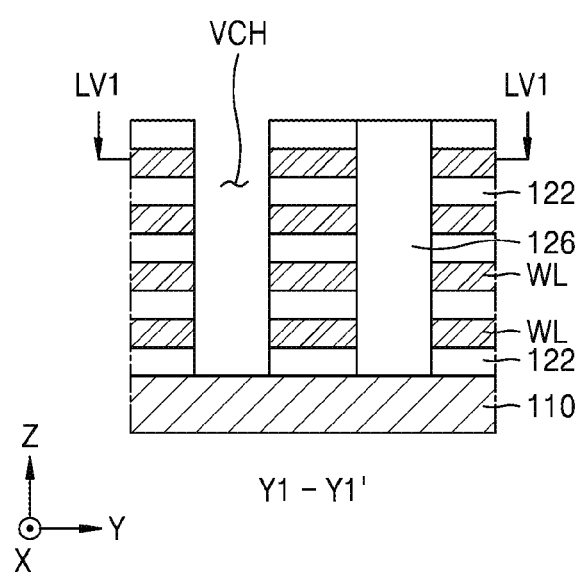

Referring to FIGS. 10A, 10B, and 10C, the plurality of vertical spaces VCH may be formed in each of the plurality of insulating blocks 126 by patterning the plurality of insulating blocks 126. The upper surface of the plate common source line 110 may be exposed at a bottom of each of the plurality of vertical spaces VCH.

Figure 11A:
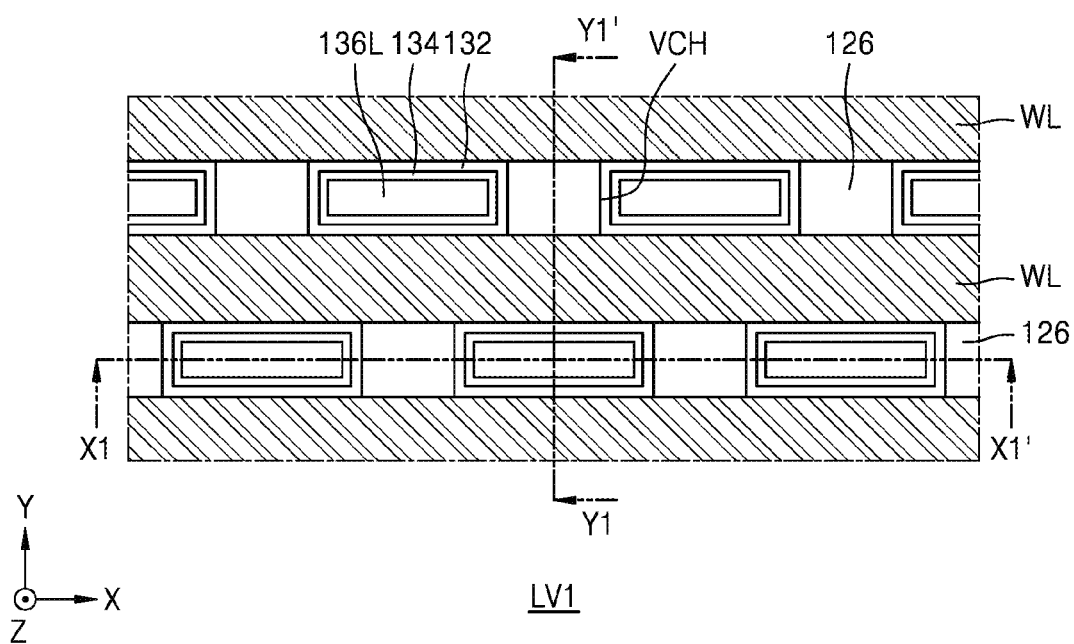
Figure 11B:
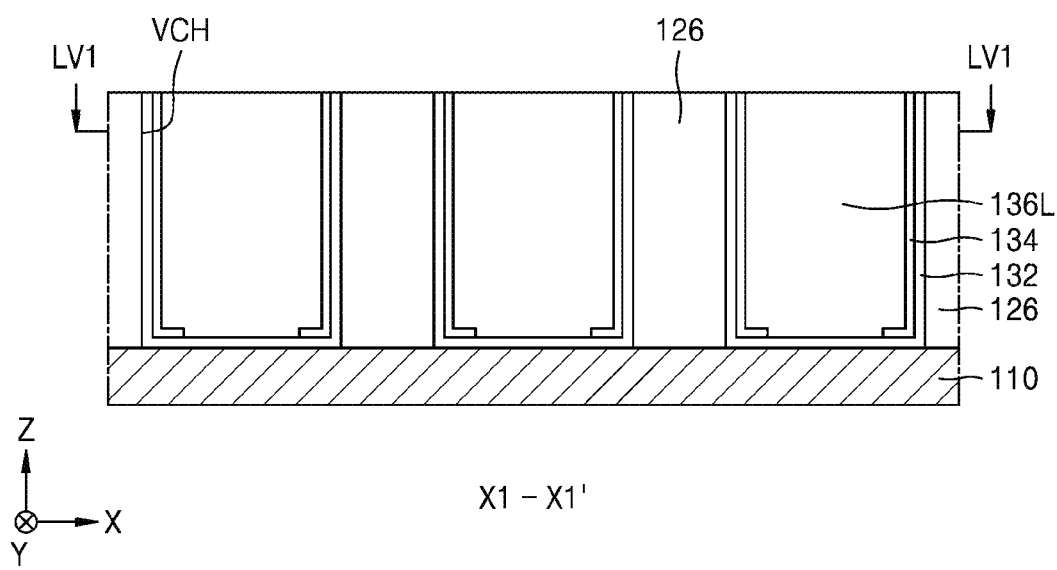
Figure 11C:
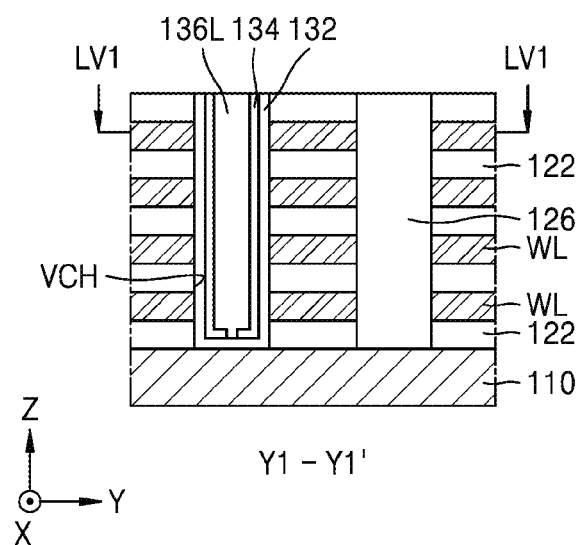

Referring to FIGS. 11A, 11B, and 11C, in a resulting product of FIGS. 10A, 10B, and 10C, the ferroelectric layer 132 and the channel pattern 134 may be formed in each of the plurality of vertical spaces VCH, and an insulating layer 136L may be formed on the channel pattern 134 to fill the remaining vertical space VCH.

In some example embodiments, the ferroelectric layer 132 may be formed to conformally cover an exposed surface of the insulating block 126 and an exposed surface of the plate common source line 110 in the vertical space VCH. In some example embodiments, to form the channel pattern 134, a channel layer may be formed to conformally cover an exposed surface of the ferroelectric layer 132 in the vertical space VCH. Next, the channel pattern 134 may be formed to expose the ferroelectric layer 132 in some regions adjacent to the bottom of the vertical space VCH, by patterning the channel layer. To pattern the channel layer, an insulating spacer (not shown) may be formed to cover a sidewall of the channel layer in the vertical space VCH, and then, the channel layer may be etched by using the insulating spacer as an etch mask. The insulating spacer may include silicon oxide. In some example embodiments, after the channel pattern 134 is formed, the insulating spacer having been used as the etch mask may be removed, and the insulating layer 136L may be formed. In some example embodiments, the insulating spacer having been used as the etch mask may constitute a portion of the insulating layer 136L without being removed.

Figure 12A:
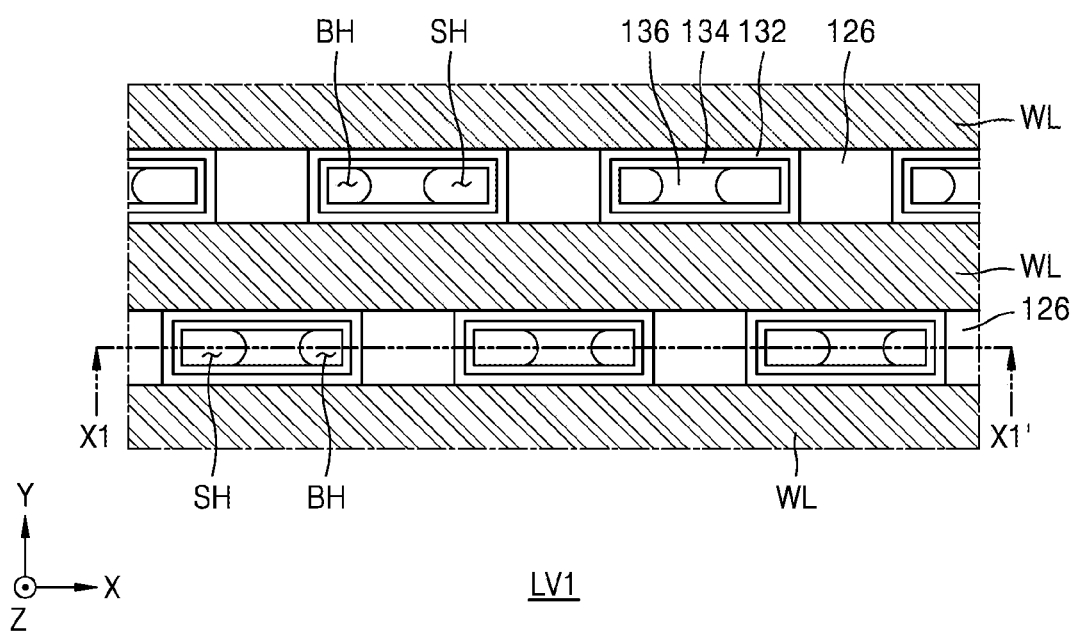
Figure 12B:
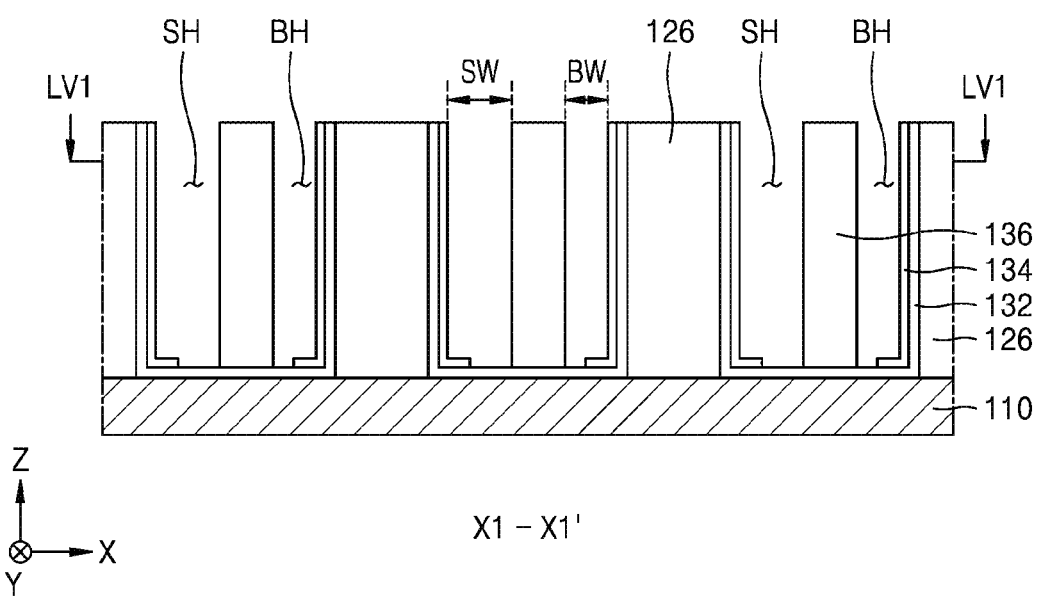

Referring to FIGS. 12A and 12B, in a resulting product of FIGS. 11A, 11B, and 11C, the insulating layer 136L in each of the plurality of vertical spaces VCH may be patterned, thereby forming the insulating plug 136 in each of the plurality of vertical spaces VCH to define a bit line hole BH and a source line hole SH. In some example embodiments, to pattern the insulating layer 136L, a photolithography process may be used.

The bit line hole BH and the source line hole SH may have different widths from each other in the first horizontal direction (X direction). The bit line hole BH may have a first width BW in the first horizontal direction (X direction), and the source line hole SH may have a second width SW, which is greater than the first width BW of the bit line hole BH, in the first horizontal direction (X direction).

Figure 13A:
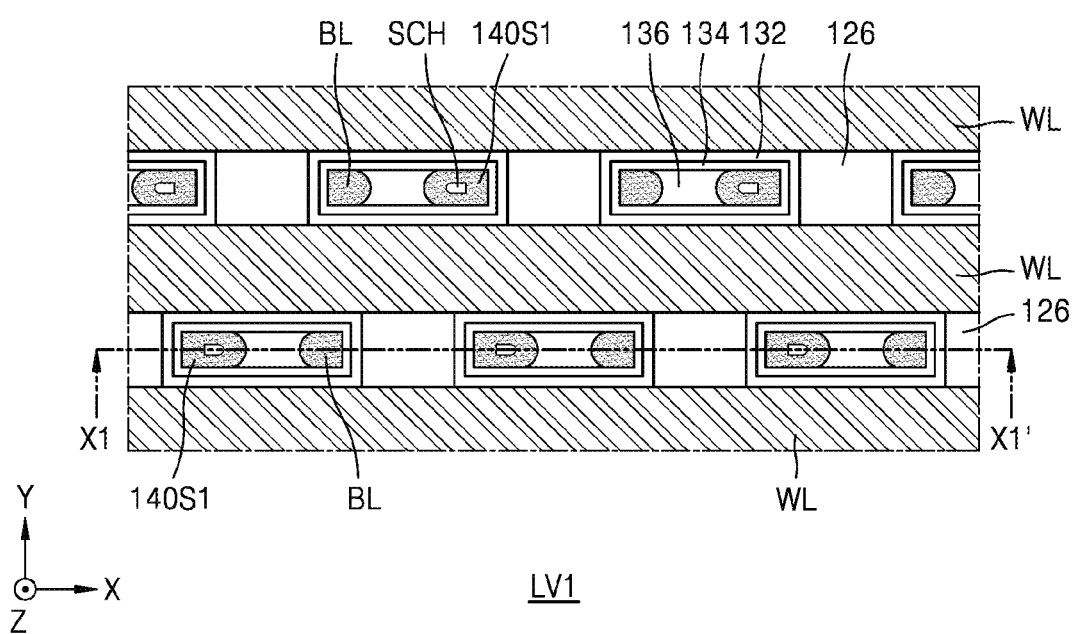
Figure 13B:
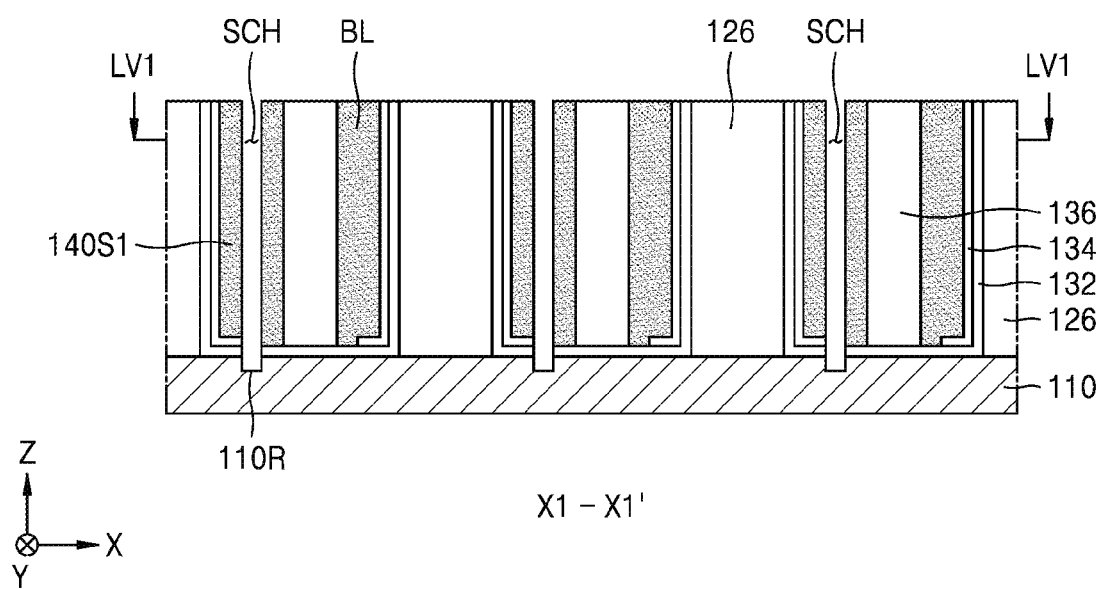

Referring to FIGS. 13A and 13B, the bit line BL, which fills the bit line hole BH, and the outer source line 140S1, which partially fills the source line hole SH, may be formed by depositing a conductive material on a resulting product of FIGS. 12A and 12B by using a width difference between the bit line hole BH and the source line hole SH. The center hole SCH, which is defined by the outer source line 140S1, may be formed in the source line hole SH. In some example embodiments, to form the bit line BL and the outer source line 140S1, an atomic layer deposition (ALD) process may be used.

Next, the ferroelectric layer 132 may be etched through the center hole SCH by using components around the center hole SCH as an etch mask, followed by partially etching the plate common source line 110, thereby forming a recess 110R in the plate common source line 110.

The recess 110R formed in the plate common source line 110 may provide a contact space allowing the source line SL, which is formed in a subsequent process, to be electrically connected to the plate common source line 110. There is no need to use a photolithography process in forming the recess 110R that provides the contact space for electrical connection between the source line SL and the plate common source line 110. Therefore, a fabrication process of the three-dimensional semiconductor device 100 may be simplified, and the process cost thereof may be reduced.

Figure 14A:
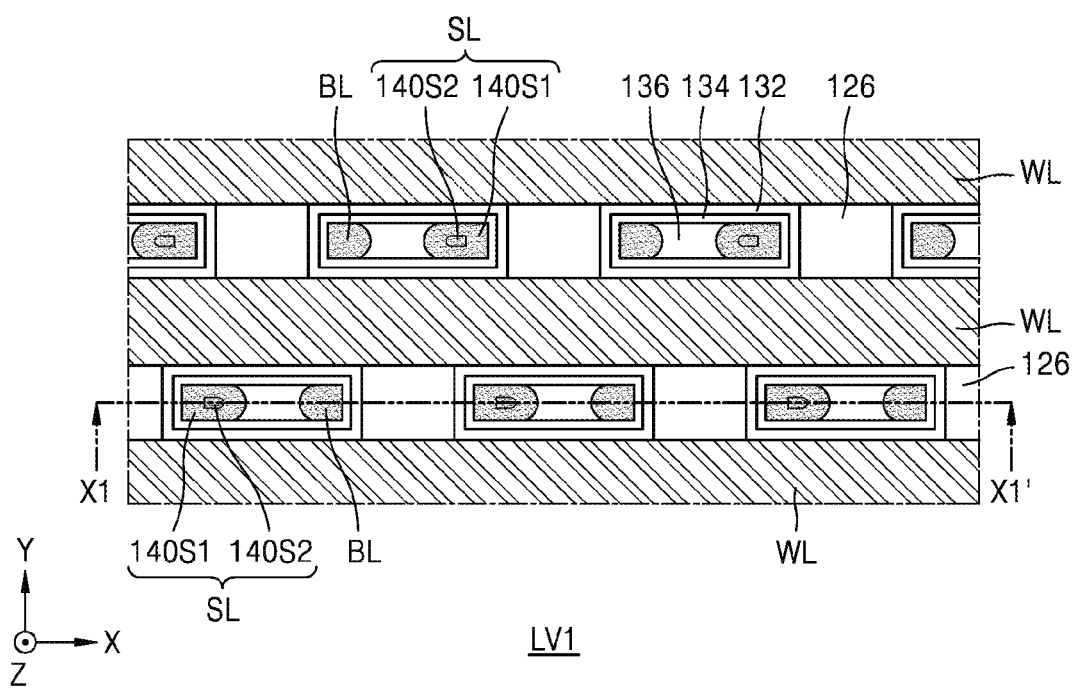
Figure 14B:
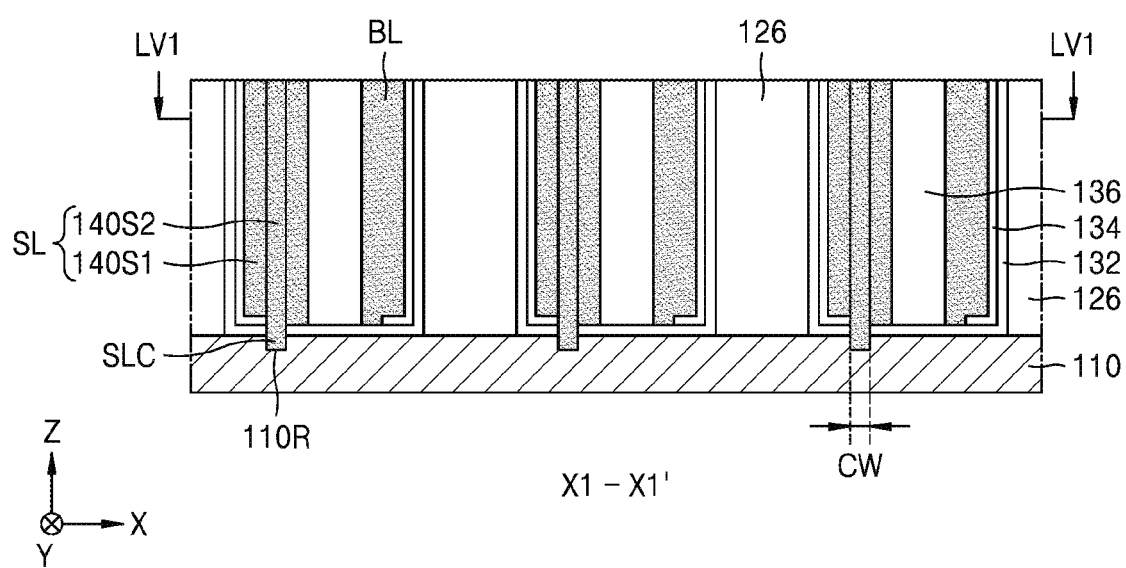

Referring to FIGS. 14A and 14B, in a resulting product of FIGS. 13A and 13B, the inner source line 140S2 may be formed to fill the center hole SCH and the recess 110R. The inner source line 140S2 may have the source line contact portion SLC that fills the recess 110R. The outer source line 140S1 and the inner source line 140S2 may constitute the source line SL.

Figure 15A:
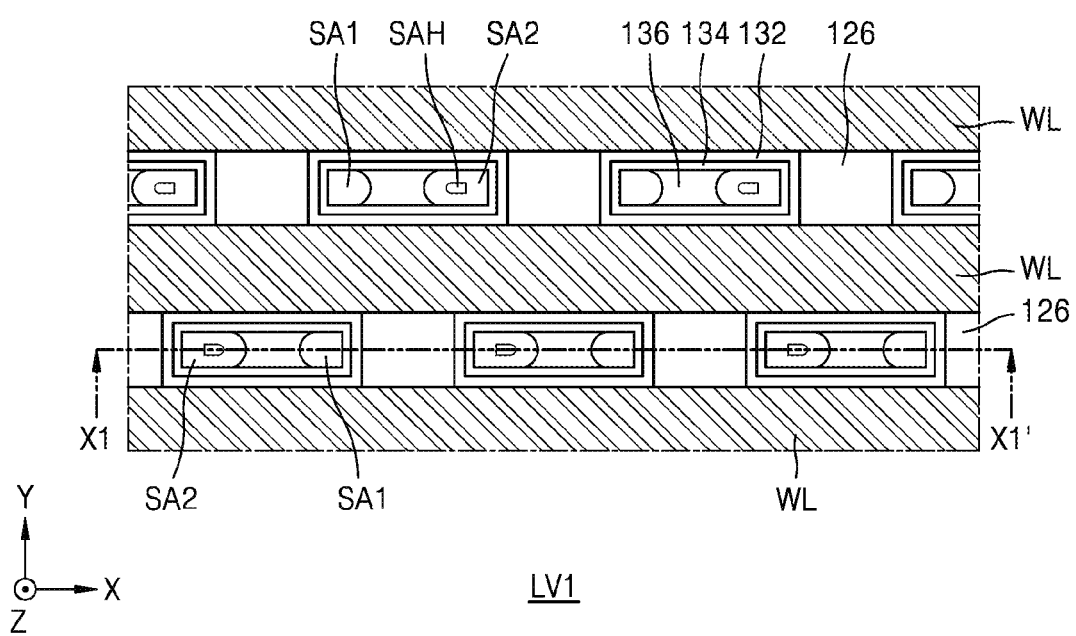
FIGS. 15A, 15B, 16A, and 16B are diagrams respectively illustrating a sequence of processes of a method of fabricating a three-dimensional semiconductor device, according to some example embodiments, and in particular.
Figure 15B:
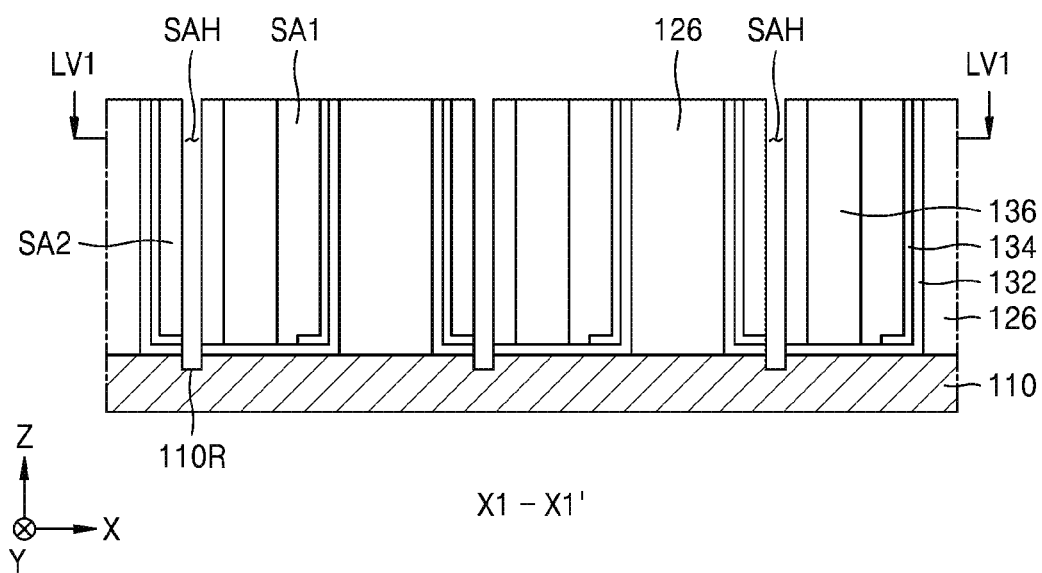
Figure 16A:
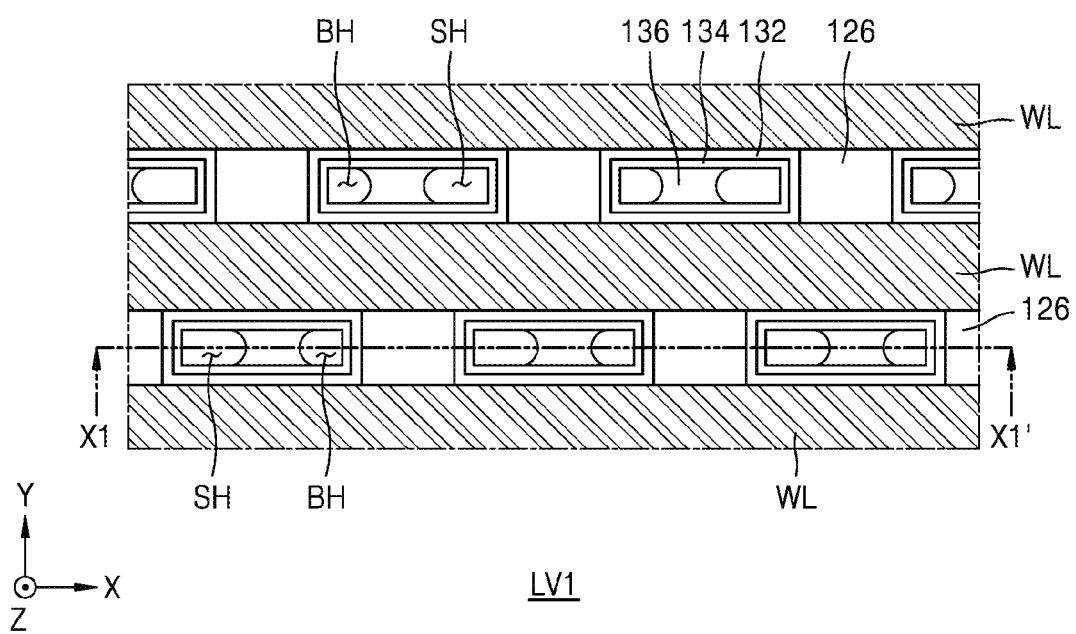
Figure 16B:
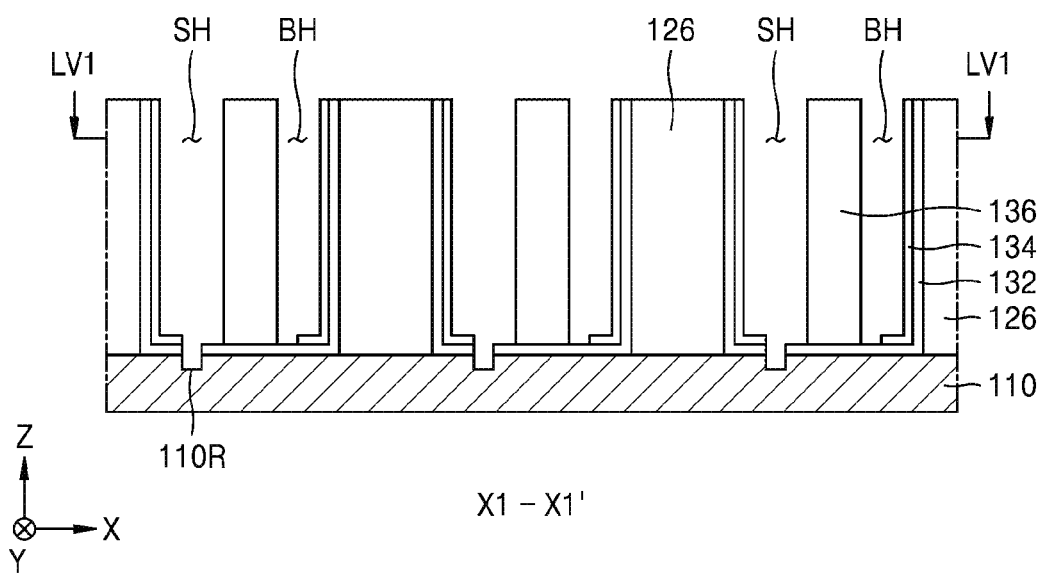

FIGS. 15A, 15B, 16A, and 16B are diagrams respectively illustrating a sequence of processes of a method of fabricating a three-dimensional semiconductor device, according to some example embodiments. In particular, FIGS. 15A and 16A are plan views illustrating the method of fabricating a three-dimensional semiconductor device according to the sequence of processes, respectively. FIGS. 15B and 16B are cross-sectional views taken along the line X1-X1' of FIGS. 15A and 16A, respectively. An example of a method of fabricating the three-dimensional semiconductor device 200 shown in FIGS. 2A and 2B is described with reference to FIGS. 15A to 16B. In FIGS. 15A to 16B, the same reference numerals as in FIGS. 1A to 1D, FIGS. 2A and 2B, and FIGS. 7A to 14B respectively denote the same members, and here, repeated descriptions thereof are omitted.

Referring to FIGS. 15A and 15B, up to the process of forming the insulating plug 136, which defines the bit line hole BH and the source line hole SH, may be performed according to the processes described with reference to FIGS. 7A to 12B. Next, a sacrificial material may be deposited on the resulting product of FIGS. 12A and 12B by using the width difference between the bit line hole BH and the source line hole SH, thereby forming a first sacrificial pattern SA1, which fills the bit line hole BH, and a second sacrificial pattern SA2, which partially fills the source line hole SH. A center hole SAH, which is defined by the second sacrificial pattern SA2, may be formed in the source line hole SH. In some example embodiments, to form the first sacrificial pattern SA1 and the second sacrificial pattern SA2, an ALD process may be used. In some example embodiments, each of the first sacrificial pattern SA1 and the second sacrificial pattern SA2 may include silicon nitride.

Next, the ferroelectric layer 132 may be etched through the center hole SAH by using components around the center hole SAH as an etch mask, followed by partially etching the plate common source line 110, thereby forming the recess 110R in the plate common source line 110.

The recess 110R formed in the plate common source line 110 may provide a contact space allowing the source line SL2, which is formed in a subsequent process, to be electrically connected to the plate common source line 110. As such, there is no need to use a photolithography process in forming the recess 110R that provides the contact space for electrical connection between the source line SL2 and the plate common source line 110. Therefore, a fabrication process of the three-dimensional semiconductor device 200 may be simplified, and the process cost thereof may be reduced.

Referring to FIGS. 16A and 16B, the bit line hole BH and the source line hole SH may be emptied again by removing the first sacrificial pattern SA1 and the second sacrificial pattern SA2 from a resulting product of FIGS. 15A and 15B. The source line hole SH may be connected to the recess 110R.

Next, the bit line BL, which fills the bit line hole BH, and the source line SL2, which fills the source line hole SH and the recess 110R, may be formed, thereby fabricating the three-dimensional semiconductor device 200 shown in FIGS. 2A and 2B.

FIGS. 17A, 17B, 17C, and 17D are cross-sectional views respectively illustrating a sequence of processes of a method of fabricating a three-dimensional semiconductor device, according to some example embodiments. FIGS. 17A to 17D each illustrate components in a cross-section corresponding to the cross-section taken along the line X1-X1' of FIG. 1A, according to the sequence of processes. An example of a method of fabricating the three-dimensional semiconductor device 300 shown in FIG. 3 will be described with reference to FIGS. 17A to 17D. In FIGS. 17A to 17D, the same reference numerals as in FIGS. 1A to 1D, FIG. 3, and FIGS. 7A to 14B respectively denote the same members, and here, repeated descriptions thereof are omitted.

Figure 17A:
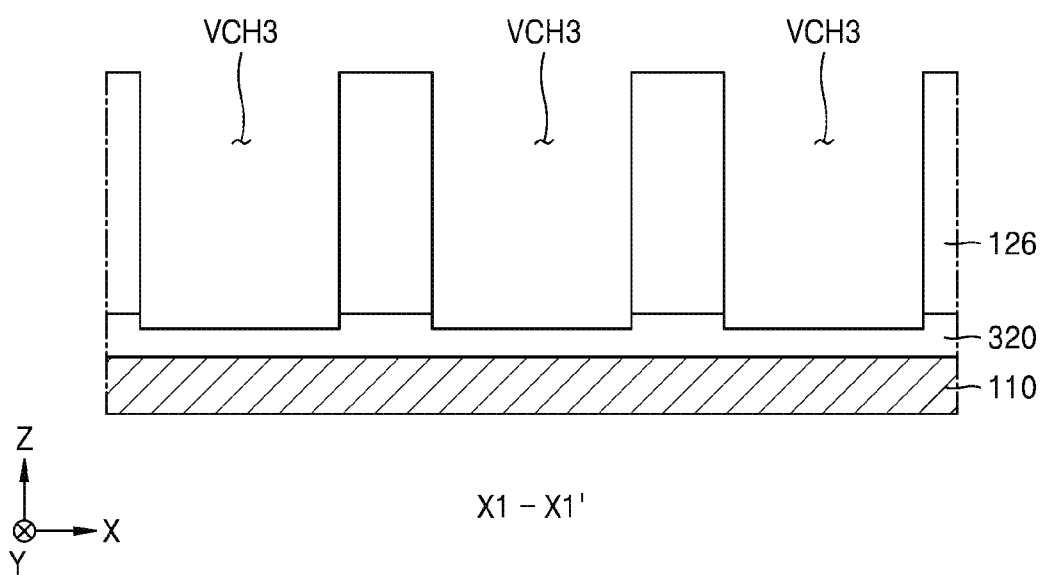
FIGS. 17A, 17B, 17C, and 17D are cross-sectional views respectively illustrating a sequence of processes of a method of fabricating a three-dimensional semiconductor device, according to some example embodiments.

Referring to FIG. 17A, by patterning the plurality of insulating blocks 126 according to similar processes to the processes described with reference to FIGS. 7A to 10B, up to a process of forming a plurality of vertical spaces VCH3 in each of the plurality of insulating blocks 126 may be performed.

However, in the process described with reference to FIGS. 7A, 7B, and 7C, a process of forming the buffer insulating layer 320 on the plate common source line 110 may be further performed. Next, a structure, in which the plurality of isolation insulating films 122 and the plurality of conductive layers 124 are alternately stacked one-by-one, may be formed on the buffer insulating layer 320. In addition, in the process described with reference to FIGS. 10A, 10B, and 10C, the plurality of vertical spaces VCH3 may be formed by patterning the plurality of insulating blocks 126. The buffer insulating layer 320 may be exposed at a bottom of each of the plurality of vertical spaces VCH3.

Figure 17B:
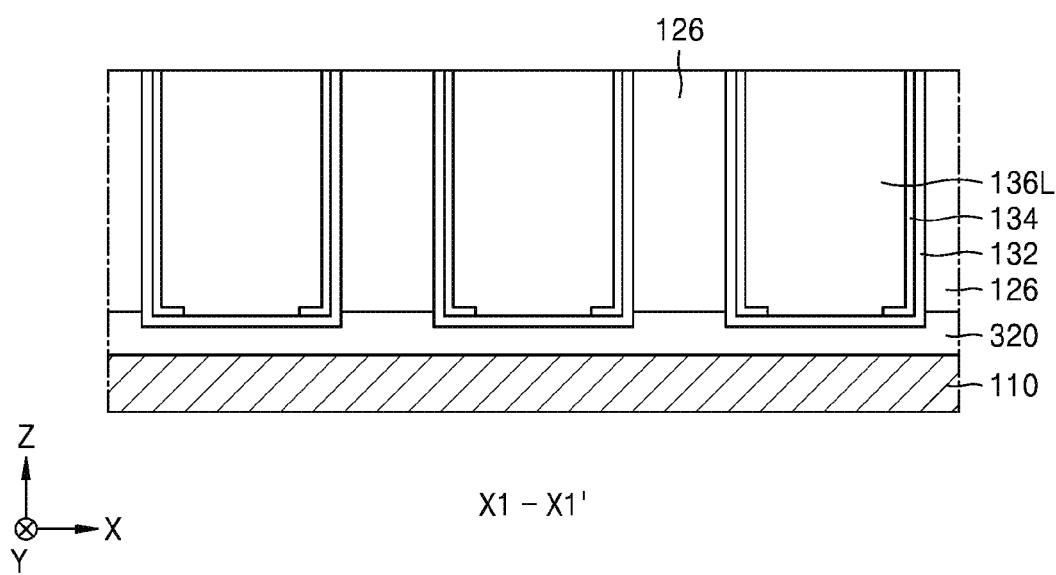

Referring to FIG. 17B, in a similar manner to that described with reference to FIGS. 11A, 11B, and 11C, the ferroelectric layer 132 and the channel pattern 134 may be formed in each of the plurality of vertical spaces VCH3 in a resulting product of FIG. 17A, and the insulating layer 136L may be formed on the channel pattern 134 to fill the remaining vertical space VCH3.

Figure 17C:
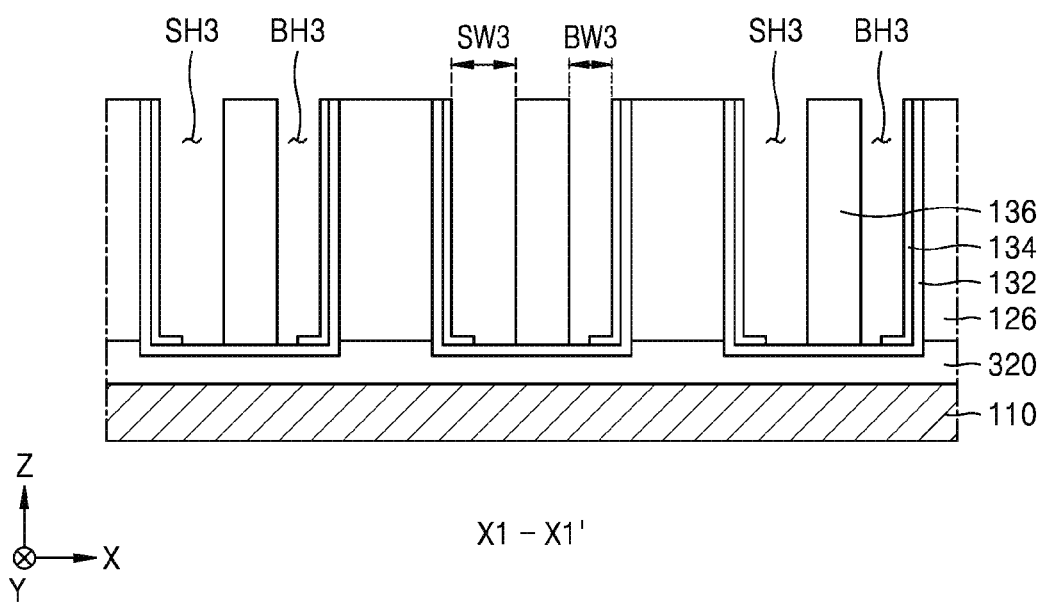

Referring to FIG. 17C, in a similar manner to that described with reference to FIGS. 12A and 12B, by patterning the insulating layer 136L in each of the plurality of vertical spaces VCH3 in a resulting product of FIG. 17B, the insulating plug 136, which defines the bit line hole BH3 and the source line hole SH3, may be formed in each of the plurality of vertical spaces VCH3. In some example embodiments, to pattern the insulating layer 136L, a photolithography process may be used.

The bit line hole BH3 and the source line hole SH3 may have different widths from each other in the first horizontal direction (X direction). The bit line hole BH3 may have a first width BW3 in the first horizontal direction (X direction), and the source line hole SH3 may have a second width SW3, which is greater than the first width BW3 of the bit line hole BH3, in the first horizontal direction (X direction).

Figure 17D:
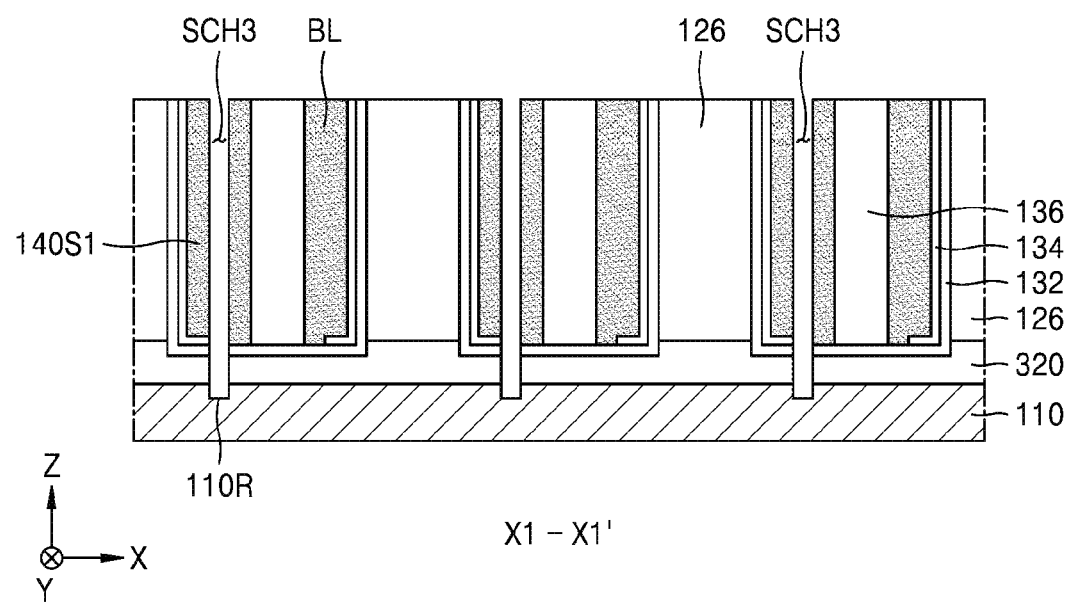

Referring to FIG. 17D, in a similar manner to that described with reference to FIGS. 13A and 13B, a conductive material may be formed on a resulting product of FIG. 17C by using a width difference between the bit line hole BH3 and the source line hole SH3, thereby forming the bit line BL, which fills the bit line hole BH3, and the outer source line 140S1, which partially fills the source line hole SH3. A center hole SCH3, which is defined by the outer source line 140S1, may be formed in the source line hole SH3. In some example embodiments, to form the bit line BL and the outer source line 140S1, an ALD process may be used.

Next, the three-dimensional semiconductor device 300 shown in FIG. 3 may be fabricated by performing a similar process to that described with reference to FIGS. 14A and 14B.

While the methods of fabricating the three-dimensional semiconductor devices 100, 200, and 300 have been described as examples with reference to FIGS. 7A to 17D, the three-dimensional semiconductor devices 400, 500, and 600 respectively shown in FIGS. 4 to 6 may be fabricated by making various modifications and changes to the descriptions given with reference to FIGS. 7A to 17D without departing from the scope of the inventive concepts. For example, to fabricate the three-dimensional semiconductor device 400 shown in FIG. 4, the peripheral circuit area PE1 may be formed first, followed by forming the plate common source line 110 on the peripheral circuit area PE1, and then, the processes described with reference to FIGS. 7A to 14B may be performed. To fabricate the three-dimensional semiconductor device 500 shown in FIG. 5, the peripheral circuit area PE1 may be formed first, followed by forming the plate common source line 110 on the peripheral circuit area PE1, and then, the processes described with reference to FIGS. 15A to 16B may be performed.

According to the method of fabricating a three-dimensional semiconductor device, according to the inventive concepts, in forming the recess 110R connected to the source line hole SH or SH3 in order to provide a contact space allowing the source line SL, SL2, or SL3 to be electrically connected to the plate common source line 110, there is no need to use a photolithography process. Therefore, a fabrication process of the three-dimensional semiconductor device according to the inventive concepts may be simplified, and the process cost thereof may be reduced.

While the inventive concepts have been particularly shown and described with reference to some example embodiments thereof, it will be understood that various changes in form and details may be made therein without departing from the spirit and scope of the following claims.

What is claimed is:

1. A three-dimensional semiconductor device, comprising:
   a plate common source line;
   a first word line and a second word line, which are arranged over the plate common source line and are spaced apart from each other such that opposing side surfaces of the first word line and the second word line at least partially define a vertical space therebetween;
   a channel pattern extending lengthwise in a vertical direction in the vertical space;
   a ferroelectric layer, the ferroelectric layer including
      a first portion of the ferroelectric layer, which is between the channel pattern and the first word line,
      a second portion of the ferroelectric layer, which is between the channel pattern and the second word line, and
      a third portion of the ferroelectric layer, which contacts the plate common source line;

a bit line arranged in the vertical space to contact the channel pattern and having a first width in a first horizontal direction; and a source line, which is spaced apart from the bit line in the vertical space to contact the channel pattern and has a second width that is greater than the first width of the bit line in the first horizontal direction, the source line having a source line contact portion that extends to an inside of the plate common source line through the ferroelectric layer, wherein the first word line and the second word line are spaced apart from each other in a second horizontal direction that is perpendicular to the first horizontal direction, such that the opposing side surfaces of the first word line and the second word line at least partially define the vertical space therebetween in the second horizontal direction.

2. The three-dimensional semiconductor device of claim 1, wherein
the first portion of the ferroelectric layer contacts the first word line,
the second portion of the ferroelectric layer contacts the second word line, and
the first portion of the ferroelectric layer and the second portion of the ferroelectric layer are integrally connected to each other.

3. The three-dimensional semiconductor device of claim 1, wherein
the channel pattern comprises
a first portion of the channel pattern, which faces the first word line with the ferroelectric layer therebetween, and
a second portion of the channel pattern, which faces the second word line with the ferroelectric layer therebetween, and
the first portion of the channel pattern and the second portion of the channel pattern are integrally connected to each other.

4. The three-dimensional semiconductor device of claim 1, wherein
a lowermost surface of the bit line contacts the ferroelectric layer, and
a lowermost surface of the source line contacts the plate common source line.

5. The three-dimensional semiconductor device of claim 1, wherein, in the first horizontal direction, a width of the source line contact portion is smaller than respective widths of other portions of the source line.

6. The three-dimensional semiconductor device of claim 1, further comprising:
an insulating plug between the bit line and the source line in the vertical space,
wherein the insulating plug is arranged eccentrically to one side in the first horizontal direction from a center of the vertical space such that opposite sides of the insulating plug in the vertical space at least partially define separate, respective spaces in the vertical space that have different volumes from each other.

7. The three-dimensional semiconductor device of claim 1, wherein the source line comprises:
an outer source line having a pipe shape, the outer source line having an outer wall contacting the channel pattern and an inner wall defining a center hole; and
an inner source line, which fills the center hole and comprises the source line contact portion.

8. The three-dimensional semiconductor device of claim 1, wherein the source line includes a source line upper portion, which is arranged at a higher vertical level than an upper surface of the plate common source line and integrally connected to the source line contact portion, the source line upper portion having a cylindrical structure, and
in the first horizontal direction, the source line upper portion has a width that is greater than a width of the source line contact portion.

9. The three-dimensional semiconductor device of claim 1, further comprising:
a buffer insulating layer between the plate common source line and the ferroelectric layer,
wherein the source line contact portion of the source line extends through the buffer insulating layer in the vertical direction.

10. The three-dimensional semiconductor device of claim 1, further comprising:
an insulating block arranged between the first word line and the second word line to at least partially define the vertical space;
an interlayer dielectric covering an upper surface of each of the bit line and the source line;
a bit line contact plug extending through the interlayer dielectric in the vertical direction and contacting the upper surface of the bit line;
a source line contact plug extending through the interlayer dielectric and the insulating block in the vertical direction and contacting the plate common source line;
a first conductive line arranged on the interlayer dielectric and connected to the bit line contact plug; and
a second conductive line arranged on the interlayer dielectric such that the second conductive line is spaced apart from the first conductive line and connected to the source line contact plug.

11. The three-dimensional semiconductor device of claim 1, further comprising:
a peripheral circuit structure, the peripheral circuit structure including a plurality of transistors and a plurality of wiring structures connected to separate, respective transistors of the plurality of transistors,
wherein the plate common source line covers the peripheral circuit structure.

12. A three-dimensional semiconductor device, comprising:
a plate common source line;
a plurality of first word lines arranged over a first region of the plate common source line to overlap each other in a vertical direction and extending lengthwise in a first horizontal direction;
a plurality of second word lines arranged over a second region of the plate common source line to overlap each other in the vertical direction and extending lengthwise in the first horizontal direction, the second region of the plate common source line being spaced apart from the first region of the plate common source line in a second horizontal direction that is perpendicular to the first horizontal direction;
an insulating block arranged between the plurality of first word lines and the plurality of second word lines to at least partially define a vertical space extending in the vertical direction;
a channel pattern extending lengthwise in the vertical direction in the vertical space;
a ferroelectric layer, which includes
a first portion of the ferroelectric layer, which is between the channel pattern and the plurality of first word lines, a second portion of the ferroelectric layer, which is between the channel pattern and the plurality of second word lines, and a third portion of the ferroelectric layer, which contacts the plate common source line;

a bit line arranged in the vertical space to contact the channel pattern and having a first width in the first horizontal direction; and a source line, which is spaced apart from the bit line in the vertical space to contact the channel pattern and has a second width that is greater than the first width of the bit line in the first horizontal direction, the source line having a source line contact portion that extends to an inside of the plate common source line through the ferroelectric layer.

13. The three-dimensional semiconductor device of claim 12, wherein the ferroelectric layer includes portions, which are spaced apart from the bit line and the source line, and at least one portion which contacts each of the bit line and the source line, and the ferroelectric layer has a cylindrical shape surrounding the bit line and the source line.

14. The three-dimensional semiconductor device of claim 12, wherein the ferroelectric layer has a closed-loop shape in a plan view.

15. The three-dimensional semiconductor device of claim 12, wherein the channel pattern includes respective portions each contacting a sidewall of each of the bit line and the source line, and the channel pattern has a cylindrical shape surrounding the bit line and the source line.

16. The three-dimensional semiconductor device of claim 12, wherein the channel pattern has a closed-loop shape in a plan view.

17. The three-dimensional semiconductor device of claim 12, further comprising:

a buffer insulating layer between the plate common source line and the ferroelectric layer, wherein the source line contact portion of the source line extends through the buffer insulating layer in the vertical direction.

18. A three-dimensional semiconductor device, comprising:

a peripheral circuit structure, which includes a plurality of transistors and a plurality of wiring structures respectively connected to the plurality of transistors;

a plate common source line covering the peripheral circuit structure;

a plurality of word lines arranged parallel to each other in a first horizontal direction over the plate common source line and overlapping each other in a vertical direction;

a plurality of insulating blocks arranged respectively on opposite sides of the plurality of word lines in a second horizontal direction, which is perpendicular to the first horizontal direction, and defining a plurality of vertical spaces that extend in the vertical direction on the opposite sides of the plurality of word lines; and a plurality of cell structures arranged in separate, respective vertical spaces of the plurality of vertical spaces, wherein each of the plurality of cell structures includes a channel pattern having a cylindrical shape extending lengthwise in the vertical direction, a ferroelectric layer, which includes a first portion of the ferroelectric layer, which is between the channel pattern and the plurality of word lines, and a second portion of the ferroelectric layer, which contacts the plate common source line, a bit line contacting the channel pattern and having a first width in the first horizontal direction, and a source line, which is spaced apart from the bit line to contact the channel pattern and has a second width that is greater than the first width of the bit line in the first horizontal direction, the source line having a source line contact portion that extends to an inside of the plate common source line through the ferroelectric layer.

19. The three-dimensional semiconductor device of claim 18, wherein the plurality of cell structures includes two cell structures, which are spaced apart from each other in the second horizontal direction with the plurality of word lines therebetween in the second horizontal direction, wherein the two cell structures face each other in the second horizontal direction, the two cell structures are arranged eccentrically in opposite directions to each other in the first horizontal direction from a straight line extending in the second horizontal direction, and the two cell structures are point-symmetric to each other with respect to one point on the straight line.

20. The three-dimensional semiconductor device of claim 18, wherein, in the first horizontal direction, a width of the source line contact portion is smaller than a width of a portion of the source line, which faces the bit line, a vertical level of a lowermost surface of the bit line is higher than a vertical level of an upper surface of the plate common source line, and a vertical level of a lowermost surface of the source line contact portion is lower than the vertical level of the upper surface of the plate common source line.

* * * * *